(12) United States Patent
Kim et al.

(10) Patent No.: US 11,770,925 B2
(45) Date of Patent: Sep. 26, 2023

(54) SEMICONDUCTOR DEVICE WITH TRENCH STRUCTURE TO REDUCE PARASITIC CAPACITANCE AND LEAKAGE CURRENT

(71) Applicant: Samsung Electronics Co., Ltd., Suwon-si (KR)

(72) Inventors: Jin A. Kim, Hwaseong-si (KR); Ho-In Ryu, Suwon-si (KR); Seong Min Park, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/339,130

(22) Filed: Jun. 4, 2021

(65) Prior Publication Data

US 2022/0102353 A1 Mar. 31, 2022

(30) Foreign Application Priority Data

Sep. 25, 2020 (KR) ........................ 10-2020-0124575

(51) Int. Cl.
*H10B 12/00* (2023.01)
*H01L 21/768* (2006.01)
*H01L 23/532* (2006.01)

(52) U.S. Cl.
CPC ....... *H10B 12/315* (2023.02); *H01L 21/7682* (2013.01); *H01L 23/5329* (2013.01);
(Continued)

(58) Field of Classification Search
CPC .......... H01L 27/10814; H01L 21/7682; H01L 23/5329; H01L 27/10823; H01L 27/10885; H01L 27/10855; H01L 27/10888; H01L 21/76897; H01L 27/1157; H01L 27/11573; H01L 27/11575; H01L 27/11582; H01L 27/10805; H01L 27/1085; H01L 23/53295;
(Continued)

(56) References Cited

U.S. PATENT DOCUMENTS 10,672,773 B2 6/2020 Ji et al.
2011/0284939 A1* 11/2011 Chung .............. H01L 27/10805
257/296

(Continued)

FOREIGN PATENT DOCUMENTS

KR 10-0363710 B1 12/2002
KR 20170052752 A 5/2017
(Continued)

*Primary Examiner* — Patricia D Valenzuela
(74) *Attorney, Agent, or Firm* — Harness, Dickey & Pierce, P.L.C.

(57) ABSTRACT

A semiconductor device includes a semiconductor substrate including a trench, a direct contact in the trench, the direct contact having a width smaller than a width of the trench, a bit line structure on the direct contact, the bit line structure having a width smaller than the width of the trench, a first spacer including a first portion and a second portion, the first portion extending along an entire side surface of the direct contact, and the second portion extending along the trench, a second spacer on the first spacer, the second spacer filling the trench, a third spacer on the second spacer, and an air spacer on the third spacer, the air spacer being spaced apart from the second spacer by the third spacer, wherein the first spacer includes silicon oxide.

20 Claims, 24 Drawing Sheets

(52) U.S. Cl.
CPC ........... *H10B 12/34* (2023.02); *H10B 12/482* (2023.02); *H01L 23/53295* (2013.01); *H10B 12/485* (2023.02)

(58) Field of Classification Search
CPC .... H10B 12/315; H10B 12/34; H10B 12/482; H10B 12/485; H10B 12/0335; H10B 43/35; H10B 43/27; H10B 43/40; H10B 43/50; H10B 12/03; H10B 12/30
See application file for complete search history.

(56) References Cited

U.S. PATENT DOCUMENTS

| | | | |
|---|---|---|---|
| 2019/0096890 A1* | 3/2019 | Lee | H01L 23/53295 |
| 2019/0206877 A1* | 7/2019 | Kim | G11C 8/08 |
| 2020/0127103 A1 | 4/2020 | Kim et al. | |
| 2020/0395363 A1* | 12/2020 | Kim | H01L 21/7682 |

FOREIGN PATENT DOCUMENTS

| | | |
|---|---|---|
| KR | 101902870 B1 | 10/2018 |
| KR | 20180129387 A | 12/2018 |

* cited by examiner

SEMICONDUCTOR DEVICE WITH TRENCH STRUCTURE TO REDUCE PARASITIC CAPACITANCE AND LEAKAGE CURRENT

CROSS-REFERENCE TO RELATED APPLICATION

This U.S. non-provisional application claims the benefit of priority under 35 U.S.C. § 119 from Korean Patent Application No. 10-2020-0124575, filed on Sep. 25, 2020 in the Korean Intellectual Property Office, and the entire contents of which are herein incorporated by reference.

BACKGROUND

Various example embodiments of the inventive concepts relate to a semiconductor device.

As semiconductor devices become more highly integrated, individual circuit patterns have become more miniaturized to realize more semiconductor devices within the same area.

On the other hand, as these semiconductor memory devices become more highly integrated, the effects of parasitic capacitance and leakage currents increase more and more. Since the parasitic capacitances and the leakage currents deteriorate the operating characteristics of the semiconductor device, a semiconductor device capable of decreasing and/or minimizing the parasitic capacitance and the leakage current is desired and/or required.

SUMMARY

Various example embodiments of the inventive concepts provide for a semiconductor device having improved operating characteristics.

According to at least one example embodiment of the inventive concepts, a semiconductor device includes a semiconductor substrate including a trench, a direct contact in the trench, the direct contact having a width smaller than a width of the trench, a bit line structure on the direct contact, the bit line structure having a width smaller than the width of the trench, a first spacer including a first portion and a second portion, the first portion extending along an entire side surface of the direct contact, and the second portion extending along the trench, a second spacer on the first spacer, the second spacer filling the trench, a third spacer on the second spacer, and an air spacer on the third spacer, the air spacer being spaced apart from the second spacer by the third spacer, wherein the first spacer includes silicon oxide.

According to at least one example embodiment of the inventive concepts, a semiconductor device includes a semiconductor substrate including an element isolation layer, an active region, and a trench, the active region defined by the element isolation layer and arranged in a first direction, and the trench formed in a part of the element isolation layer and the active region, a plurality of buried contacts connected to the active region and arranged in a second direction different from the first direction, a direct contact in the trench, the direct contact having a width smaller than a width of the trench, and the direct contact being connected to the active region, a plurality of bit line structures connected to the semiconductor substrate through the direct contact, the plurality of bit lines structures extending in a third direction across the active region between at least two buried contacts of the plurality of the buried contacts, and a spacer structure extending in the third direction along side surfaces of the plurality of bit line structures, wherein the spacer structure includes a first spacer, a second spacer, a third spacer, and an air spacer, the first spacer extending along a side surface of the direct contact and the trench, the second spacer on the first spacer and filling a remaining portion of the trench, the third spacer including a vertical portion and a horizontal portion, the vertical portion extending along a side surface of the bit line structure and the horizontal portion extending along a top surface of the second spacer, and the air spacer on the third spacer and spaced apart from the second spacer by the vertical portion of the third spacer, and the first spacer including silicon oxide.

According to at least one example embodiment of the inventive concepts, a semiconductor device includes a semiconductor substrate including a gate trench, at least one gate electrode filling at least a part of the gate trench and extending in a first direction, at least one source/drain region on a side surface of the at least one gate electrode, a plurality of buried contacts electrically connected to the at least one source/drain region, the plurality of buried contacts being arranged in the first direction, at least one landing pad on the at least one buried contact, at least one capacitor structure on the at least one landing pad and electrically connected to the at least one landing pad and the at least one buried contact, at least one bit line structure extending in a second direction between at least two of the plurality of buried contacts, the at least one bit structure including a conductive pattern and a capping pattern on the conductive pattern, and a spacer structure on a side surface of the at least one bit line structure and extending in the second direction, wherein the spacer structure includes a first spacer extending along a lower side surface of the bit line structure, a second spacer on the first spacer, a third spacer extending along an upper side surface of the bit line structure, a top surface of the first spacer, and a top surface of the second spacer, an air spacer above the second spacer and the third spacer, the air spacer spaced apart from the second spacer by the third spacer, and a fourth spacer on the second spacer and the air spacer on the top surface of the first spacer, the first spacer including silicon oxide, and the second to fourth spacers including silicon nitride.

However, the aspects of the various example embodiments of the inventive concepts are not restricted to the one set forth herein. The above and other aspects of the example embodiments will become more apparent to one of ordinary skill in the art to which the inventive concepts pertain by referencing the detailed description of the example embodiments given below.

BRIEF DESCRIPTION OF THE DRAWINGS

The above and other aspects and features of various example embodiments of the inventive concepts will become more apparent by describing in detail example embodiments thereof with reference to the attached drawings, in which.

DETAILED DESCRIPTION

Figure 1:
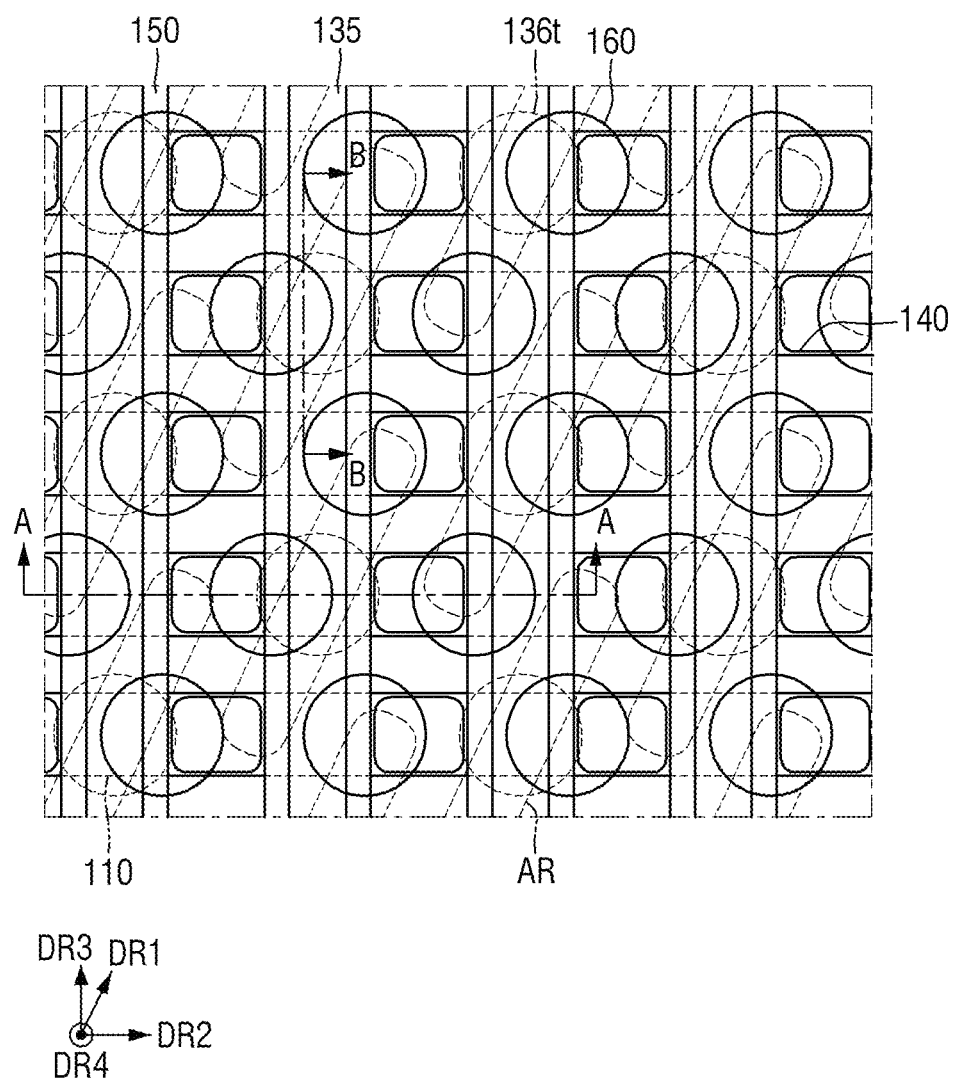
FIG. 1 is a layout diagram illustrating a semiconductor device according to at least one example embodiment.
Figure 2:
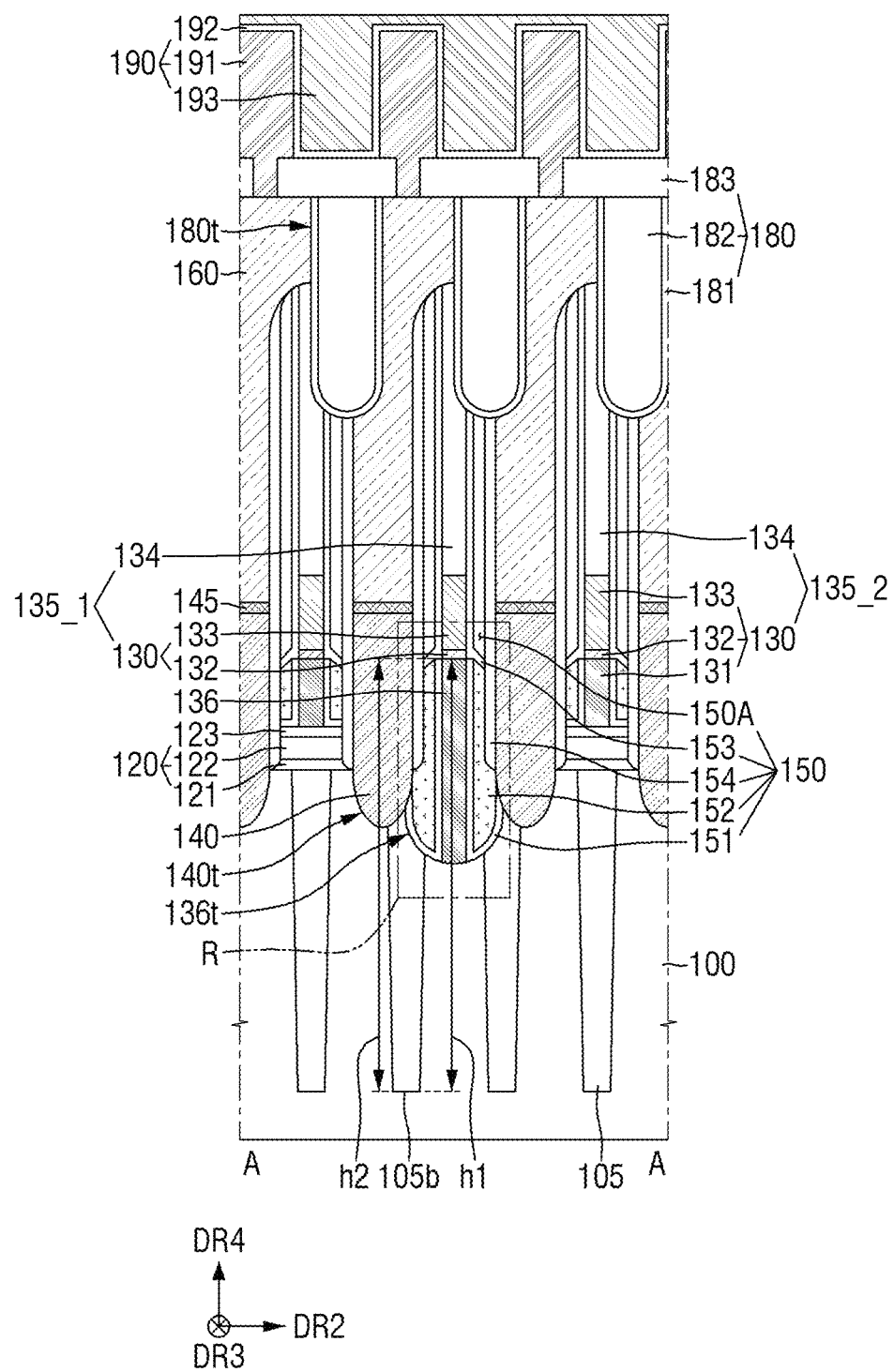
FIG. 2 is a cross-sectional view taken along line A-A of FIG. 1 according to at least one example embodiment.
Figure 3A:
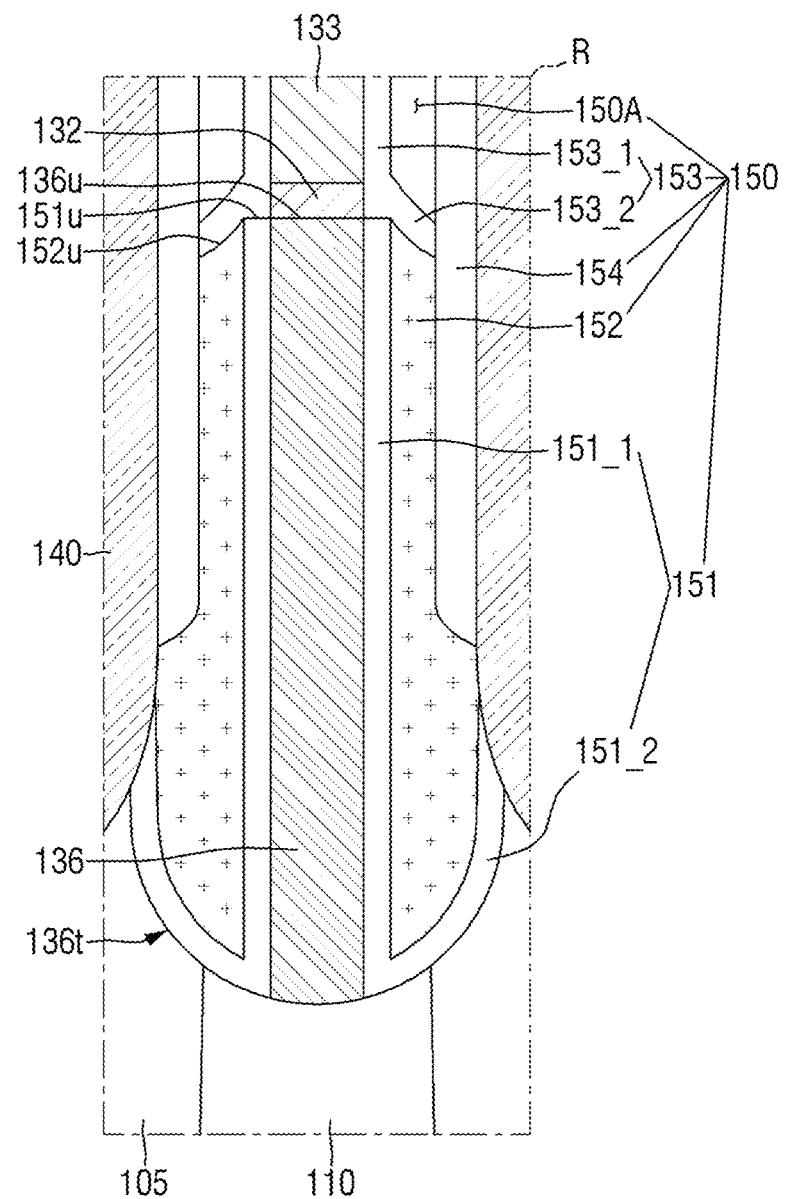
FIGS. 3A and 3B are various enlarged views of area R of FIG. 2 according to at least one example embodiment.
Figure 3B:
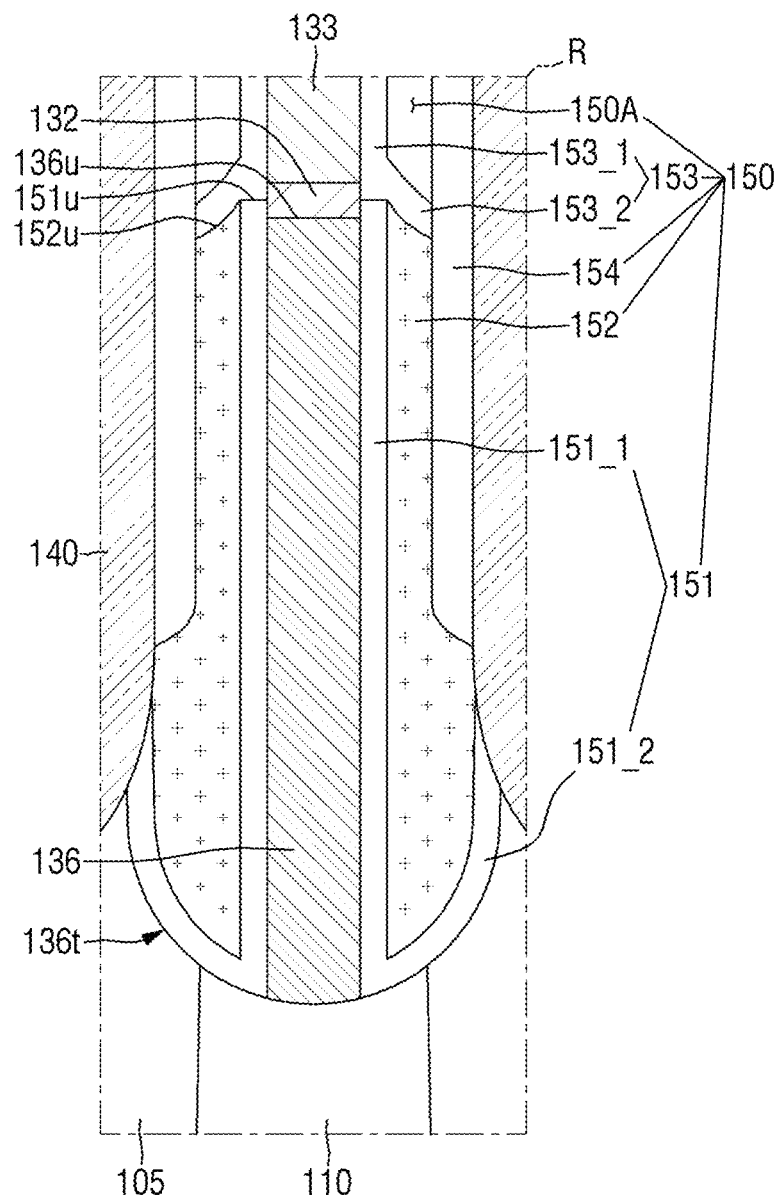
Figure 4:
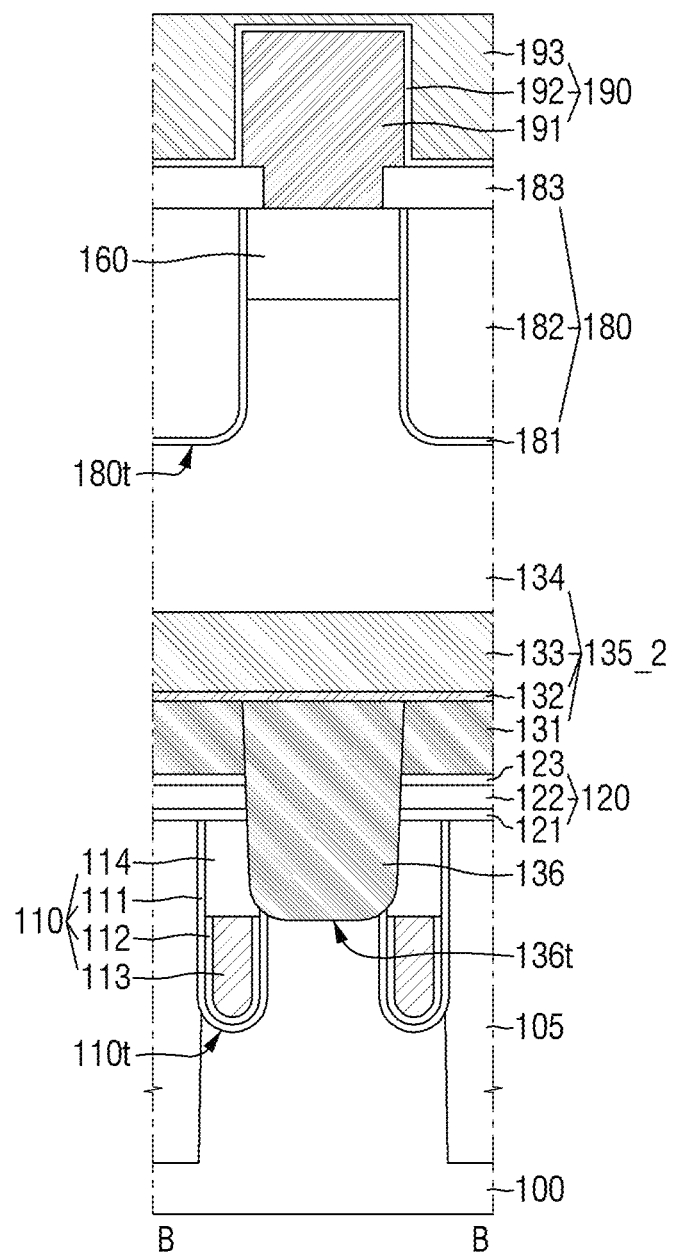
FIG. 4 is a cross-sectional view taken along line B-B of FIG. 1 according to at least one example embodiment.

FIG. 1 is a layout diagram illustrating a semiconductor device according to at least one example embodiment. FIG. 2 is a cross-sectional view taken along line A-A of FIG. 1 according to at least one example embodiment. FIGS. 3A and 3B are various enlarged views of area R of FIG. 2 according to some example embodiments. FIG. 4 is a cross-sectional view taken along line B-B of FIG. 1 according to at least one example embodiment.

Referring to FIGS. 1 to 4, a semiconductor device according to at least one example embodiment include a substrate 100, at least one element isolation layer 105, at least one word line structure 110, at least one insulating pattern 120, bit line structures 135_1 and 135_2, at least one direct contact 136, at least one spacer structure 150, at least one buried contact 140, at least one interlayer insulating layer 180, and/or at least one capacitor structure 190, etc., but the example embodiments are not limited thereto. For example, in some example embodiments, the semiconductor device may have a plurality of element isolation layers, word line structures, insulating patterns, direct contacts, spacer structures, buried contacts, interlayer insulating layers, and/or capacitor structures, etc.

The substrate 100 (e.g., a semiconductor substrate) may have a structure in which a base substrate and an epitaxial layer are stacked, but the example embodiments are not limited thereto. The substrate 100 may be a silicon substrate, a gallium arsenide substrate, a silicon germanium substrate, and/or a silicon-on-insulator (SOI) substrate, etc., but are not limited thereto. In the following description, it is assumed that the substrate 100 is a silicon substrate for the sake of convenience and brevity, but the example embodiments are not limited thereto.

The substrate 100 may include a plurality of active regions AR. As the design rule of the semiconductor device decreases (e.g., the physical area of the design of the semiconductor device decreases), the active region AR may be formed in a diagonal bar shape, but the example embodiments are not limited thereto and other shapes may be used. For example, as illustrated in FIG. 1, the active region AR may have a bar shape extending in a first direction DR1. The active regions AR may be arranged in the first direction DR1, but are not limited thereto. Among the active regions AR, one active region AR may be arranged such that its center is located close to an end of another active region AR, but the example embodiments are not limited thereto.

The active region AR may include impurities to function as a source/drain region. As shown in FIG. 2, in at least one example embodiment, the center of the active region AR may be electrically connected to the first bit line structure 135_1 using the direct contact 136, and both ends of the active region AR may be electrically connected to the capacitor structure 190 by one or more contact structures, such as contact structures 140, 145, and/or 160, etc., but the example embodiments are not limited thereto. For example, the contact structures 140, 145, and 160 may include a buried contact 140, a silicide layer 145, and a landing pad 160 that are sequentially stacked, but the example embodiments are not limited thereto.

The element isolation layer 105 may define the active regions AR. Although it is illustrated in the drawings that the side surface of the element isolation layer 105 is inclined, this is only the characteristics of the process and the example embodiments are not limited thereto.

The element isolation layer 105 may include silicon oxide, silicon nitride or a combination thereof, but is not limited thereto, and may be other types of insulating material. The element isolation layer 105 may be a single layer made of one kind of insulating material or a multilayer made of a combination of several kinds of insulating materials.

The word line structure 110 may be elongated along a second direction DR2 across the active region AR and the bit line structure 135, but is not limited thereto. For example, the word line structure 110 may diagonally cross the active region AR and vertically cross the bit line structure 135, etc. A plurality of word line structures 110 may extend in parallel with each other, but are not limited thereto. The plurality of word line structures 110 may be spaced apart from each other at equal intervals and/or other desired intervals, etc.

As shown in FIGS. 3A, 3B, and 4, in at least one example embodiment, the word line structure 110 may be buried in the substrate 100. For example, the substrate 100 may include a gate trench 110t extending in the second direction DR2, but the example embodiments are not limited thereto. The word line structure 110 may include a gate dielectric layer 111, a first gate electrode 112, a second gate electrode 113, and/or a gate capping pattern 114, etc., but is not limited thereto.

According to at least one example embodiment, the gate dielectric layer 111 may extend along the sidewall and the bottom surface of the gate trench 110t, but is not limited thereto. The gate dielectric layer 111 may extend along at least a part of the profile of the gate trench 110t, etc. The gate dielectric layer 111 may include, for example, at least one of silicon oxide, silicon oxynitride, silicon nitride, and/or a high dielectric constant (high-k) material having a dielectric constant greater than that of the silicon oxide, without being limited thereto.

The first gate electrode 112 and the second gate electrode 113 may be sequentially formed on the gate dielectric layer 111. The first gate electrode 112 and the second gate electrode 113 may fill at least a part of the gate trench 110t, but the example embodiments are not limited thereto.

Although it is illustrated in FIG. 4 that the word line structure 110 is a multilayer including the two gate electrodes 112 and 113, the example embodiments are not limited to thereto and the word line structure 110 may be a single layer including one gate electrode, etc. The first gate electrode 112 and the second gate electrode 113 may each be, for example, metal, polysilicon, etc., and/or any combinations thereof, but are not limited thereto.

According to some example embodiments, the gate capping pattern 114 may be formed on the second gate electrode 113. The gate capping pattern 114 may fill the remaining gate trench 110t after the formation of the first gate electrode 112 and the second gate electrode 113, but the example embodiments are not limited thereto. Although it is illustrated in FIG. 4 that the gate dielectric layer 111 extends along the sidewall of the gate capping pattern 114, the example embodiments are not limited thereto.

The gate capping pattern 114 may include, for example, at least one of silicon nitride (SiN), silicon oxynitride (SiON), silicon oxide ($SiO_2$), silicon carbonitride (SiCN), silicon oxycarbonitride (SiOCN), etc., or any combinations thereof.

The insulating pattern 120 may be formed on the substrate 100 and the element isolation layer 105, but is not limited thereto. In some example embodiments, the insulating pattern 120 may extend along the top surface of the substrate 100 and the top surface of the element isolation layer 105 in a region where the direct contact 136 and the buried contact 140 are not formed, etc.

The insulating pattern 120 may be a single layer or a multilayer as shown in FIGS. 2 and 4. For example, the insulating pattern 120 may include a first insulating layer 121, a second insulating layer 122, and/or a third insulating layer 123 sequentially stacked on the substrate 100, but the example embodiments are not limited thereto, and there may be a greater or lesser number of insulating layers.

The first insulating layer 121 may include, for example, silicon oxide, but is not limited thereto. The second insulating layer 122 may include a material having an etch selectivity different from that of the first insulating layer 121, but is not limited thereto. For example, the second insulating layer 122 may include silicon nitride, etc. The third insulating layer 123 may include a material having a dielectric constant smaller than that of the second insulating layer 122, but is not limited thereto. For example, the third insulating layer 123 may include silicon oxide, etc.

The bit line structures 135_1 and 135_2 may be formed on the substrate 100 and the element isolation layer 105, but the example embodiments are not limited thereto. The bit line structures 135_1 and 135_2 may be elongated along a third direction DR3 across the active region AR and the word line structure 110. For example, the bit line structures 135_1 and 135_2 may diagonally cross the active region AR and vertically cross the word line structure 110, but the example embodiments are not limited thereto. The multiple bit line structures 135_1 and 135_2 may extend in parallel with each other, but are not limited thereto. The multiple bit line structures 135_1 and 135_2 may be spaced apart from each other at equal intervals and/or at other desired intervals.

As shown in FIG. 2, according to some example embodiments, the bit line structures 135_1 and 135_2 may include the first bit line structure 135_1 overlapping the substrate 100, and the second bit line structure 135_2 overlapping the element isolation layer 105, but the example embodiments are not limited thereto. The first bit line structure 135_1 may be formed on the direct contact 136, but is not limited thereto. The second bit line structure 135_2 may be formed on the insulating pattern 120, but is not limited thereto.

The bit line structures 135_1 and 135_2 may include a conductive pattern 130 and a capping pattern 134 sequentially formed on the substrate 100, but the example embodiments are not limited thereto.

The conductive pattern 130 may be a single layer or a multilayer as shown in FIG. 2. For example, the conductive pattern 130 may include a plurality of conductive layers, such as a first conductive layer 131, a second conductive layer 132, and/or a third conductive layer 133, etc., sequentially stacked on the substrate 100, but the example embodiments are not limited thereto.

The plurality of conductive layers, such as the first conductive layer 131, the second conductive layer 132, and the third conductive layer 133, etc., may each include, for example, polysilicon, TiN, TiSiN, tungsten, tungsten silicide, etc., or any combinations thereof, but is not limited thereto. For example, the first conductive layer 131 may include polysilicon, the second conductive layer 132 may include TiSiN, and the third conductive layer 133 may include tungsten, etc.

The capping pattern 134 may be formed on the conductive pattern 130. For example, the capping pattern 134 may be formed on the third conductive layer 133, but is not limited thereto. The capping pattern 134 may include silicon nitride, but is not limited thereto.

The direct contact 136 may penetrate the insulating pattern 120 to connect the active region AR of the substrate 100 to the at least one bit line structure, such as bit line structures 135_1 and 135_2, etc. The direct contact 136 may penetrate the insulating pattern 120 in a fourth direction DR4, but is not limited thereto. For example, as shown in FIGS. 2 to 3B, the substrate 100 may include a first trench 136t formed in the active region AR and the element isolation layer 105, but the example embodiments are not limited thereto. As show in FIG. 4, according to some example embodiments, the first trench 136t may penetrate the insulating pattern 120 to expose at least a part of the active region AR, but the example embodiments are not limited thereto. The direct contact 136 may be formed in the first trench 136t to connect the active region AR to the conductive pattern 130, etc.

In some example embodiments, as shown in FIG. 1, the first trench 136t may expose the center of the active region AR. Accordingly, the direct contact 136 may overlap the center of the active region AR, but is not limited thereto. Further, the first bit line structure 135_1 disposed on the direct contact 136 may overlap the center of the active region AR, but is not limited thereto. In some example embodiments, a part of the first trench 136t may overlap a part of the element isolation layer 105, but is not limited thereto. Accordingly, the first trench 136t may expose a part of the element isolation layer 105 as well as a part of the substrate 100, but the example embodiments are not limited thereto.

The direct contact 136 may contain a conductive material. Accordingly, the conductive patterns 130 of the bit line structures, such as bit line structures 135_1 and 135_2, etc., may be electrically connected to the active region AR of the substrate 100, but is not limited thereto. The active region AR of the substrate 100 connected to the conductive patterns 130 and the direct contact 136 may function as a source/drain region.

In at least one example embodiment, the direct contact 136 may contain the same material as that of the first conductive layer 131, but is not limited thereto. For example, the direct contact 136 may contain polysilicon, etc. However, the example embodiments are not limited thereto, and the direct contact 136 may contain a conductive material different from that of the first conductive layer 131 depending on a manufacturing process.

In some example embodiments, the width of the direct contact 136 may be smaller than the width of the first trench 136t, but the example embodiments are not limited thereto. For example, as shown in FIG. 2, the direct contact 136 may overlap only a part of the substrate 100 exposed by the first trench 136t. The direct contact 136 may be located at the center of the substrate 100 exposed by the first trench 136t, but the example embodiments are not limited thereto.

In at least one example embodiment, the width of the bit line structures 135_1 and 135_2 may be smaller than the width of the first trench 136t, but the example embodiments are not limited thereto. As another example, the width of the bit line structures 135_1 and 135_2 may be substantially the same as the width of the direct contact 136, or may be greater than the width of the direct contact 136, etc.

The buried contact 140 may be formed on the substrate 100 between the multiple bit line structures 135_1 and 135_2, etc. For example, as shown in FIG. 2, the buried contact 140 may be in the region defined by the word line structure 110 and the bit line structures 135_1 and 135_2, but is not limited thereto. The buried contacts 140 may form a plurality of isolated regions separated from each other. The buried contacts 140 may be arranged in the first direction DR1 and the second direction DR2, but are not limited thereto.

As shown in FIG. 2, according to some example embodiments, the buried contact 140 may penetrate the insulating pattern 120 to connect the active region AR of the substrate 100 to the landing pad 160, but the example embodiments are not limited thereto. For example, the substrate 100 may include a contact recess 140*t* in the active region AR, but is not limited thereto. The contact recess 140*t* may penetrate the insulating pattern 120 to expose a part of the active region AR. The buried contact 140 may be formed in the contact recess 140*t* to connect the active region AR of the substrate 100 to the landing pad 160, but the example embodiments are not limited thereto.

In at least one example embodiment, the contact recess 140*t* may expose both ends of the active region AR. Accordingly, as shown in FIG. 1, the buried contact 140 may be connected to both ends of the active region AR, but is not limited thereto. A part of the contact recess 140*t* may overlap a part of the element isolation layer 105. Accordingly, the contact recess 140*t* may expose a part of the element isolation layer 105 as well as a part of the substrate 100, etc.

The buried contact 140 may include a conductive material. Accordingly, the buried contact 140 may be electrically connected to the active region AR of the substrate 100, but is not limited thereto. The active region AR of the substrate 100 connected to the buried contact 140 may function as a source/drain region. The buried contact 140 may include, for example, polysilicon, but is not limited thereto.

The spacer structure 150 may contact the side surfaces of the bit line structures 135_1 and 135_2, but is not limited thereto. The spacer structure 150 may extend along the side surfaces of the bit line structures, such as bit line structures 135_1 and 135_2, etc., but is not limited thereto. The spacer structure 150 may be elongated along the third direction DR3 as shown in FIG. 1, but is not limited thereto. In other words, the buried contact 140 may be spaced apart from the bit line structures 135_1 and 135_2 by the spacer structure 150.

In at least one example embodiment, a part of the spacer structure 150 may be in contact with the substrate 100 and/or the element isolation layer 105, but is not limited thereto. For example, in a region where the first trench 136*t* is formed, the lower part of the spacer structure 150 may fill the first trench 136*t*, but the example embodiments are not limited thereto. However, in a region where the first trench 136*t* is not formed, the spacer structure 150 may be formed on the insulating pattern 120, etc.

The spacer structure 150 may be multilayer, but is not limited thereto, and for example may be a single layer. For example, the spacer structure 150 may include a plurality of spacers, such as first to fourth spacers 151, 152, 153, and 154, and an air spacer 150A, etc., but the example embodiments are not limited thereto.

Referring to FIGS. 2 and 3A, according to at least one example embodiment, the first spacer 151 may include a first portion 151_1 extending along the side surface of the direct contact 136, and a second portion 151_2 extending along the first trench 136*t*. Further, according to some example embodiments, the first portion 151_1 of the first spacer 151 may be in contact with the side surface of the direct contact 136. The top surface of the first portion 151_1 of the first spacer 151 may be higher than the top surface of the second portion 151_2 of the first spacer 151, but the example embodiments are not limited thereto. An uppermost surface 151*u* of the first spacer 151 may be the top surface of the first portion 151_1 of the first spacer 151.

The first spacer 151 may extend along at least a part of the side surface of the second bit line structure 135_2, but the example embodiments are not limited thereto. The first spacer 151 may extend along the side surface of the first conductive layer 131 of the second bit line structure 135_2, but is not limited thereto. Further, the first spacer 151 may be in contact and/or direct contact with the side surface of the first conductive layer 131 of the second bit line structure 135_2, etc.

In at least one example embodiment, the first portion 151_1 of the first spacer 151 may extend along the entire side surface of the direct contact 136. The uppermost surface 151*u* of the first spacer 151 may be on the same plane and/or on substantially the same plane as a top surface 136*u* of the direct contact 136, but is not limited thereto. In other words, the first spacer 151 may be level with and/or approximately on the same plane and/or substantially the same plane as the top surface 136*u* of the direct contact 136, etc.

According to some example embodiments, the second spacer 152 may be on the first spacer 151, but is not limited thereto. The second spacer 152 may fill at least a portion of and/or all of the first trench 136*t*. For example, the second spacer 152 may fill the remaining first trench 136*t* after the formation of the direct contact 136 and the first spacer 151, but is not limited thereto.

The second spacer 152 may extend along the side surface of the direct contact 136, but is not limited thereto. The second spacer 152 may extend along the side surface of the first conductive layer 131 of the second bit line structure 135_2, but is not limited thereto.

As shown in FIGS. 3A and 3B, in at least one example embodiment, a height h2 from a bottom surface 105*b* of the element isolation layer 105 to a top surface 152*u* of the second spacer 152 may be substantially the same or smaller than a height h1 from the bottom surface 105*b* of the element isolation layer 105 to the uppermost surface 151*u* of the first spacer 151. For example, the height h2 from (e.g., the distance between) the bottom surface 105*b* of the element isolation layer 105 to the top surface 152*u* of the second spacer 152 may be reduced from and/or less than the height h1 from (e.g., the distance between) the bottom surface 105*b* of the element isolation layer 105 to the uppermost surface 151*u* of the first spacer 151 as a distance of the top surface 152*u* of the second spacer 152 from the bit line structures 135_1 and 135_2 increases, but the example embodiments are not limited thereto. The top surface 152*u* of the second spacer 152 may be curved downwards away from the bit line structures 135_1 and/or 135_2 as shown in FIGS. 3A and 3B, but the example embodiments are not limited thereto and the top surface 152*u* of the second spacer may have a different shape, such as a flat shape, etc.

The third spacer 153 may be on the second spacer 152, but the example embodiments are not limited thereto. The third spacer 153 may extend along at least a portion of the side surfaces of the bit line structures 135_1 and 135_2, the uppermost surface 151*u* of the first spacer 151, and the top surface 152*u* of the second spacer 152, but is not limited thereto. The third spacer 153 may be conformal to and/or may contact the side surfaces of the bit line structures 135_1 and 135_2, the uppermost surface 151*u* of the first spacer 151, and the top surface 152*u* of the second spacer 152, etc., but the example embodiments are not limited thereto.

In other words, the third spacer 153 may have an "L" shape and/or a substantially "L" shape, but is not limited thereto, wherein the third spacer 153 has an elongate portion in a first direction and a shorter portion in a second direction that is approximately 90 degrees or greater away from the elongate portion, etc. The third spacer 153 may include a vertical portion 153_1 extending along the side surfaces of the bit line structures 135_1 and 135_2, and a horizontal portion 153_2 extending along the top surface 152u of the second spacer 152. Here, the "L shape" means not only the case where the vertical portion 153_1 and the horizontal portion 153_2 form an angle of 90 degrees, but also the case where the vertical portion 153_1 and the horizontal portion 153_2 meet at an angle above 90 degrees but less than 180 degrees. In other words, the angle between the vertical portion 153_1 of the third spacer 153 and the horizontal portion 153_2 of the third spacer 153 may be, e.g., a right angle or an obtuse angle. Further, here, the "L shape" includes not only a case where the bent portion has an angled shape but also a case where the bent portion has a rounded shape, or other desired shape, etc.

The air spacer 150A may be on the third spacer 153, but is not limited thereto. The air spacer 150A may extend along at least a portion of the side surfaces of the bit line structures 135_1 and 135_2 on the third spacer 153. The air spacer 150A may be spaced apart from the second spacer 152 by the horizontal portion 153_2 of the third spacer 153. The air spacer 150A may be defined by a third spacer 153 and a fourth spacer 154, but is not limited thereto.

The air spacer 150A may be air or void (e.g., an empty space), but is not limited thereto. Additionally, the air spacer 150A may have a lower dielectric constant than that of silicon oxide, etc. Therefore, the parasitic capacitance of the semiconductor device according to at least one example embodiment may be effectively reduced, and therefore the operating characteristics of the semiconductor memory device of at least one example embodiment may be improved.

The fourth spacer 154 may be on the second portion 151_2 of the first spacer 151, but is not limited thereto. The fourth spacer 154 may extend along at least a part of the side surface of the direct contact 136 and the side surface of the first bit line structure 135_1 on the second portion 151_2 of the first spacer 151, etc. The fourth spacer 154 may be spaced apart from the vertical portion 153_1 of the third spacer 153 by the air spacer 150A, and may be spaced apart from the first portion 151_1 of the first spacer 151 by the second spacer 152, but the example embodiments are not limited thereto.

According to some example embodiments, the fourth spacer 154 may be on the first portion 151_1 of the first spacer 151 and the second spacer 152, but is not limited thereto. The lower side surface of the second spacer 152 may be in contact with the first portion 151_1 of the first spacer 151, and the upper side surface of the second spacer 152 may be in contact with the fourth spacer 154, but is not limited thereto.

In some example embodiments, the bottom surface of the fourth spacer 154 may be lower than the top surface 152u of the second spacer 152. The bottom surface of the fourth spacer 154 may be on the first portion 151_1 of the first spacer 151 and the second spacer 152, but is not limited thereto. At least a part of the lower portion of the fourth spacer 154 may be inserted into the second spacer 152, but the example embodiments are not limited thereto.

As shown in FIG. 2, according to some example embodiments, the fourth spacer 154 may extend along at least a part of the side surface of the second bit line structure 135_2.

Additionally, the fourth spacer 154 may extend along at least a part of the side surface of the insulating pattern 120, etc.

Referring to FIGS. 2 and 3B, in at least one example embodiment, the top surface 136u of the direct contact 136 may be lower than the uppermost surface 151u of the first spacer 151, but is not limited thereto. Accordingly, the height h2 from the bottom surface 105b of the element isolation layer 105 to the top surface 152u of the second spacer 152 may be reduced from and/or less than the height h1 from the bottom surface 105b of the element isolation layer 105 to the uppermost surface 151u of the first spacer 151 as a distance of the top surface 152u of the second spacer 152 from the bit line structures 135_1 and 135_2 increases.

In at least one example embodiment, the first spacer 151 may be made of a material different from materials forming the second to fourth spacers 152, 153, and 154, and the second to fourth spacers 152, 153, and 154 may be made of the same material, but the example embodiments are not limited thereto. For example, the first spacer 151 may be made of silicon oxide, and the second to fourth spacers 152, 153, and 154 may be made of silicon nitride, but they are not limited thereto.

When the spacer in contact with the direct contact 136 is made of silicon nitride, the silicon nitride may be in contact with a depletion region of the direct contact 136 to form an interface trap. The interface trap may increase the resistance of the direct contact 136 and thereby increase the leakage current. Further, as the semiconductor device becomes more highly integrated, the effects of the parasitic capacitance and the leakage current increase more and more. For example, as a gap between the conductive patterns of a dynamic random access memory (DRAM) becomes narrower, the parasitic capacitance between the conductive patterns may be increased.

However, in a semiconductor device according to at least one example embodiment, the direct contact 136 is in contact with the first spacer 151 made of silicon oxide, so that the formation of the interface trap may be reduced and/or decreased, etc. Accordingly, the resistance of the direct contact 136 may be reduced and/or decreased, and the leakage current may be reduced and/or decreased. Further, in the semiconductor device according to at least one example embodiment, the parasitic capacitance of the semiconductor device may be more effectively reduced and/or decreased by the first spacer 151 made of silicon oxide and the air spacer 150A, which makes it possible to improve the operating characteristics of the semiconductor device (e.g., the operating characteristics of the DRAM device, etc.).

On the other hand, as shown in FIG. 2, the silicide layer 145 may be formed on the buried contact 140. The silicide layer 145 may cover a part of the top surface of the buried contact 140, or may completely cover the top surface of the buried contact 140 as shown in FIG. 2. Unlike the example shown in FIG. 2, according to some example embodiments, the silicide layer 145 may be omitted from the buried contact 140 and the landing pad 160. The silicide layer 145 may include, for example, cobalt silicon (CoSix), but the example embodiments are not limited thereto, and a different material may be used for the silicide layer.

The landing pad 160 may be formed on the silicide layer 145. The landing pad 160 may be electrically connected to the buried contact 140 through the silicide layer 145. In at least one example embodiment, the top surface of the landing pad 160 may be higher than the top surfaces of the bit line structures 135_1 and 135_2, but is not limited thereto. Additionally, according to some example embodiments, the landing pad 160 may cover a part of the top surfaces of the bit line structures 135_1 and 135_2, etc.

The plurality of landing pads 160 may form a plurality of isolated regions separated from each other. Although it is illustrated in FIG. 1 that each landing pad 160 has a circular shape, this is only an example and the example embodiments are not limited thereto. Further, although it is illustrated in FIG. 1 that the plurality of landing pads 160 are arranged in a honeycomb structure, this is only an example and the example embodiments are not limited thereto.

The plurality of landing pads 160 may be respectively connected to the buried contacts 140 forming a plurality of isolated regions according to some example embodiments. For example, the landing pads 160 may be separated from each other by a second trench 180t, but are not limited thereto.

The landing pad 160 may include a conductive material. Accordingly, as shown in FIGS. 1 and 2, the capacitor structure 190 may be electrically connected to the active region AR of the substrate 100. The landing pad 160 may include, for example, tungsten, without being limited thereto.

In at least one example embodiment, a part of the second trench 180t may expose a part of the bit line structures 135_1 and 135_2. For example, the second trench 180t may extend from the top surface of the landing pad 160 to be lower than the top surfaces of the bit line structures 135_1 and 135_2. Accordingly, the plurality of landing pads 160 may be separated from each other by the bit line structures 135_1 and 135_2 and the second trench 180t. In at least one example embodiment, the bottom surface of the second trench 180t may be higher than the bottom surface of the capping pattern 134, but the example embodiments are not limited thereto. Accordingly, the second trench 180t may expose a part of the capping pattern 134, etc.

Since the spacer structure 150 may be between the bit line structures 135_1 and 135_2 and the buried contact 140, the second trench 180t may expose at least a part of the top surfaces of a plurality of spacers, such as the third spacer 153, the fourth spacer 154, and the air spacer 150A, etc. For example, the second trench 180t may define the air spacer 150A, but the example embodiments are not limited thereto.

The interlayer insulating layer 180 may be formed on at least a part of the top surface of the landing pad 160 and at least a part of the bit line structures 135_1 and 135_2. The interlayer insulating layer 180 may include a plurality of layers, such as the first to third layers 181, 182, and 183, but is not limited thereto.

The first layer 181 may extend along the second trench 180t. The first layer 181 may extend along the second trench 180t. The second layer 182 may fill at least a portion of the second trench 180t on the first layer 181. For example, the second layer 182 may fill the remaining second trench 180t after the formation of the first layer 181, but is not limited thereto. Accordingly, the first and second layers 181 and 182 may define a region of the landing pads 160 forming a plurality of isolated regions, but the example embodiments are not limited thereto. The first and second layers 181 and 182 may separate the plurality of landing pads 160 from each other. In at least one example embodiment, the first layer 181 and the second layer 182 may be on the plane and/or substantially the same plane (e.g., level with, etc.) as the top surfaces of the plurality of landing pads 160, but are not limited thereto.

The third layer 183 may be on the first layer 181, the second layer 182, and/or the landing pad 160, etc. For example, the third layer 183 may be patterned to expose a part of the top surfaces of the landing pads 160.

In at least one example embodiment, the first layer 181 may be formed of SiCN, the second layer 182 may be formed of SiN, and the third layer 183 may be formed of SIBN, but are not limited thereto, and other insulator materials may be used for the layers. Accordingly, the interlayer insulating layer 180 may electrically separate the plurality of landing pads 160 from each other.

The capacitor structure 190 may be on the interlayer insulating layer 180 and the landing pad 160. The capacitor structure 190 may be connected to a part of the top surface of the landing pad 160 exposed by the interlayer insulating layer 180. As a result, the capacitor structure 190 may be electrically connected to the landing pad 160, the silicide layer 145, and the source/drain region connected to the buried contact 140, but the example embodiments are not limited thereto. Accordingly, the capacitor structure 190 may store electric charges in a semiconductor memory element or the like.

For example, as shown in FIGS. 2 and 4, the capacitor structure 190 may include a lower electrode 191, a capacitor dielectric layer 192, and/or an upper electrode 193, etc., but is not limited thereto. The capacitor structure 190 may store electric charges in the capacitor dielectric layer 192 by using a potential difference generated between the lower electrode 191 and the upper electrode 193. Additionally, in the event that the semiconductor device of the example embodiment is a memory device, such as a DRAM device, etc., the stored electric charges, or lack thereof, in the capacitor structure 190 may represent data (e.g., a bit of data), etc.

The lower electrode 191 and the upper electrode 193 may include, for example, doped polysilicon, metal, and/or metal nitride, etc., without being limited thereto. In addition, the capacitor dielectric layer 192 may include, for example, silicon oxide or other high-k material, without being limited thereto.

Figure 5:
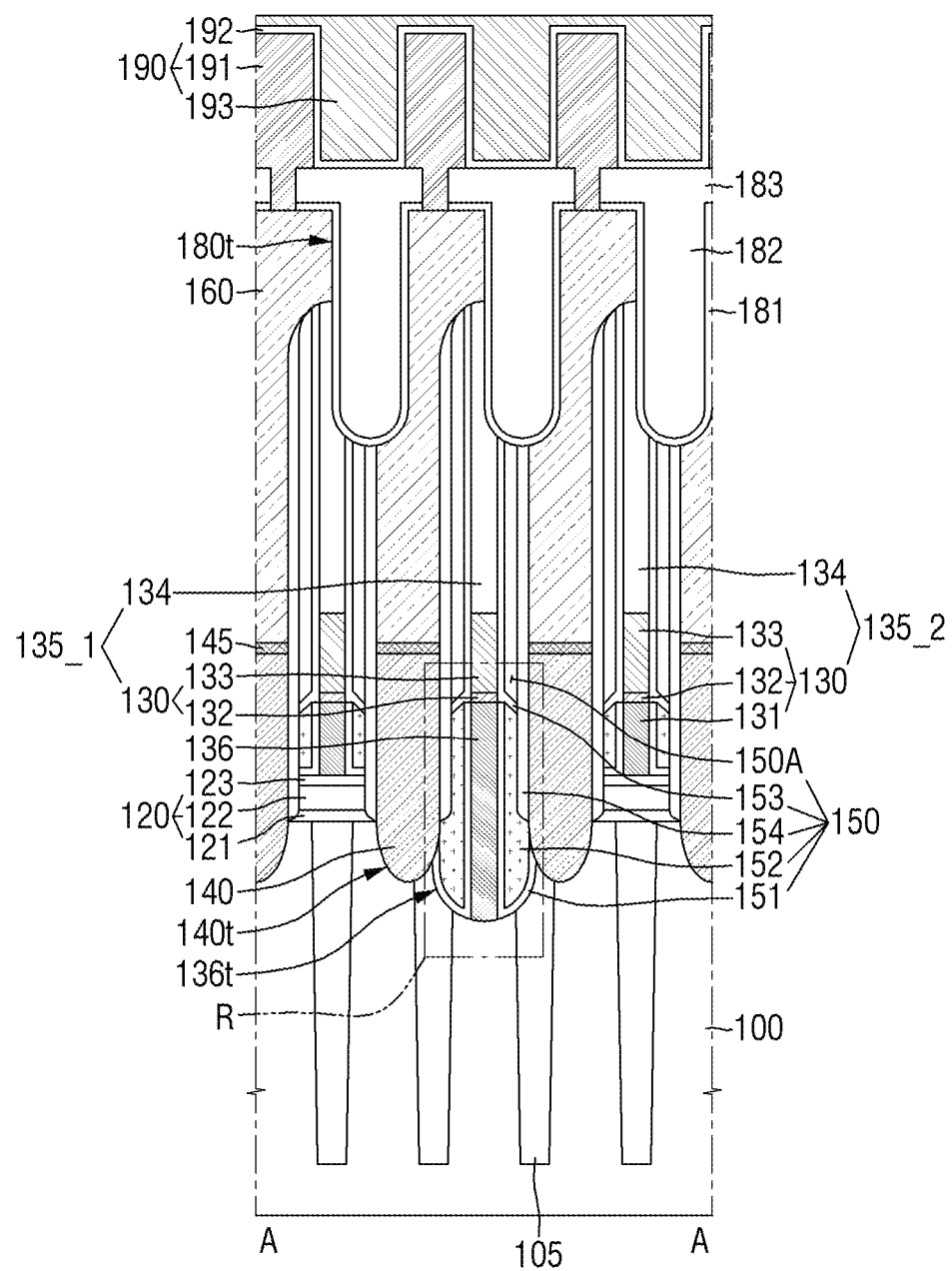
FIG. 5 is a cross-sectional view illustrating a semiconductor device according to at least one example embodiment.
Figure 5:
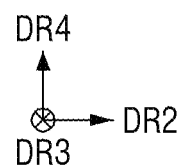

FIG. 5 is a cross-sectional view illustrating a semiconductor device according to at least one example embodiment. For simplicity of description, features shared between FIG. 5 and FIGS. 1 to 4 may be omitted.

Referring to FIG. 5, in the semiconductor device according to at least one example embodiment, the first layer 181 may extend along the second trench 180t and the top surface of the landing pad 160. The first layer 181 may extend along the second trench 180t and the top surface of landing pad 160, or in other words, the first layer 181 may contact the second trench 180t to the top surface of the landing pad 160, etc., but is not limited thereto. The top surface of the first layer 181 may be on the same or substantially the same plane (e.g., level with, etc.) as the top surface of the second layer 182, and the top surface of the first layer 181 may be higher than the top surface of the landing pad 160, but the example embodiments are not limited thereto. The third layer 183 may be on at least a portion of the first and second layers 181 and 182, but is not limited thereto.

Figure 6:
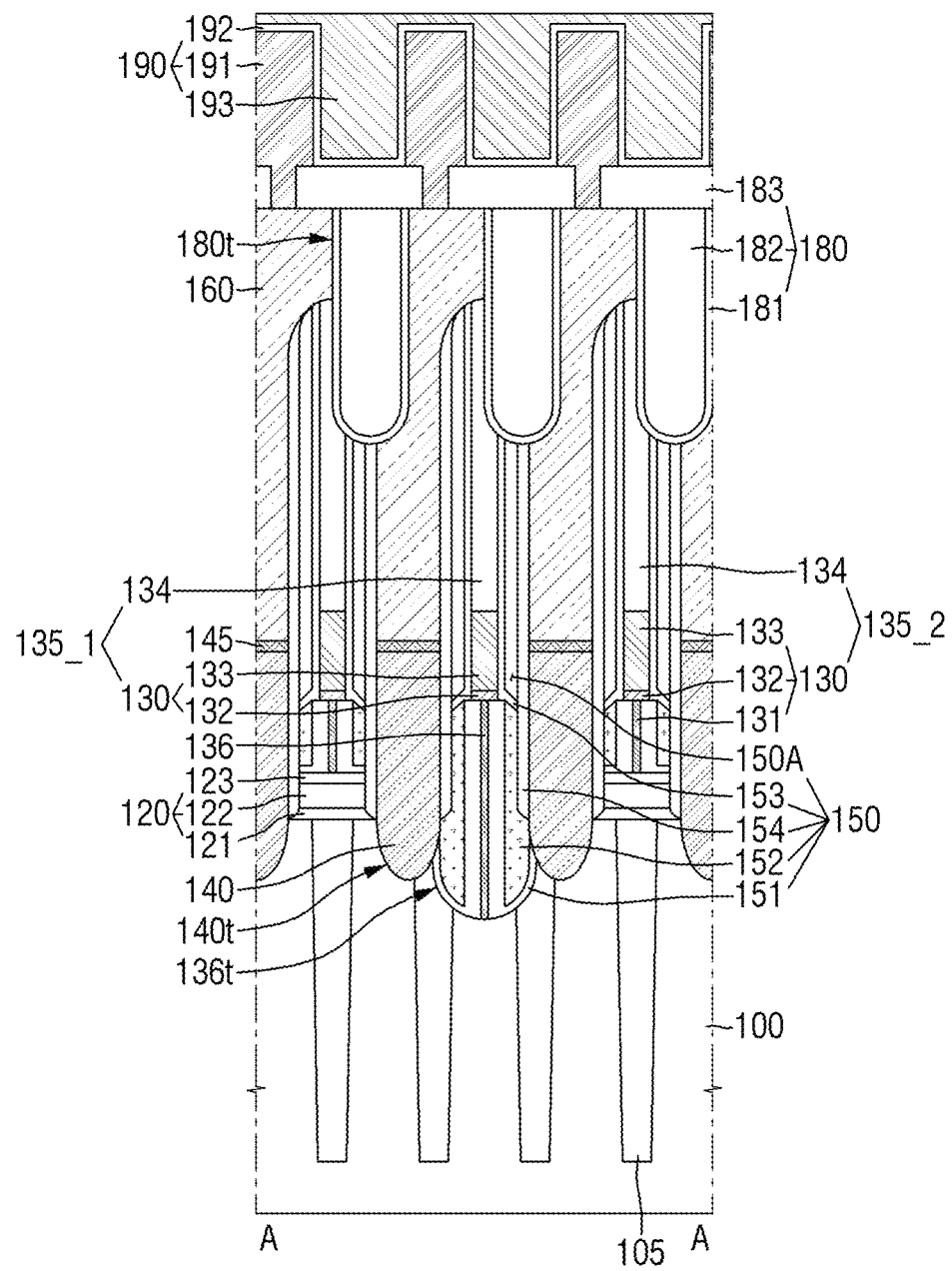
FIG. 6 is a cross-sectional view illustrating a semiconductor device according to at least one example embodiment.

FIG. 6 is a cross-sectional view illustrating a semiconductor device according to at least one example embodiment. For simplicity of description, features shared between FIG. 6 and FIGS. 1 to 5 may be omitted.

Referring to FIG. 6, in the semiconductor device according to some example embodiments, the width of the direct contact 136 may be different from the width of the bit line structures 135_1 and 135_2. The width of the direct contact 136 may be smaller than the width of the bit line structures 135_1 and 135_2, but is not limited thereto.

The width of the first conductive layer 131 may be smaller than, e.g., the width of the bit line structures 135_1 and 135_2. In other example embodiments, the width of the first conductive layer 131 may be substantially the same as or greater than the width of the direct contact 136, etc.

FIGS. 7 to 23 are diagrams illustrating the intermediate steps of a method for fabricating a semiconductor device according to some example embodiments. For simplicity of description, features shared with FIGS. 1 to 4 may be omitted. For reference, FIGS. 7 to 23 are cross-sectional views taken along line A-A of FIG. 1 according to some example embodiments.

Figure 7:
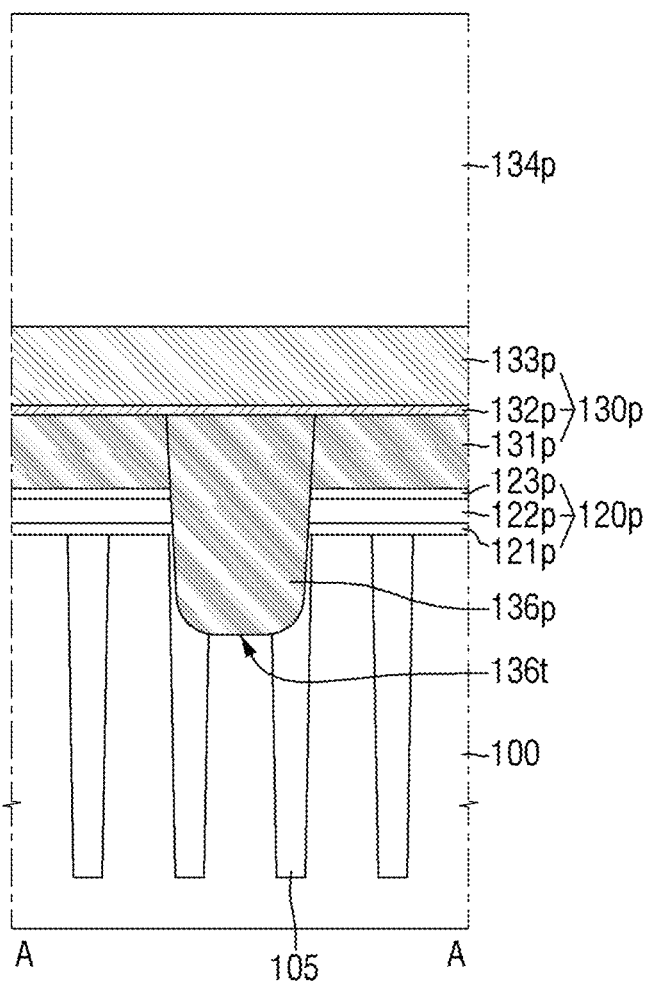
FIGS. 7 to 23 are diagrams illustrating the intermediate steps of a method for fabricating a semiconductor device according to at least one example embodiment.
Figure 7:
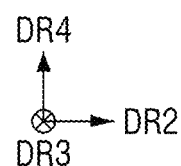

Referring to FIG. 7, a plurality of pre-insulating layers, such as first to third pre-insulating layers 121*p*, 122*p*, and 123*p*, etc., a plurality of pre-conductive layers, e.g., first to third pre-conductive layers 131*p*, 132*p*, and 133*p*, etc., at least one pre-direct contact 136*p*, and/or at least one pre-capping pattern 134*p* may be sequentially formed on the substrate 100 (e.g., semiconductor substrate) and/or the element isolation layer 105, but the example embodiments are not limited thereto. For example, the number of pre-insulating layers, pre-conductive layers, pre-direct contact, and/or pre-capping pattern may be greater or lesser than the number shown in FIG. 7.

Additionally, the plurality of pre-insulating layers, e.g., first to third pre-insulating layers 121*p*, 122*p*, and 123*p*, and the plurality of pre-conductive layers, e.g., first to third pre-conductive layers 131*p*, 132*p*, and 133*p*, may be sequentially formed on the substrate 100 and/or the element isolation layer 105, etc. Next, the first trench 136*t* may be formed in the substrate 100 to expose a part of the active region AR (see FIG. 1). In at least one example embodiment, the first trench 136*t* may expose the center of the active region AR. Next, the pre-direct contact 136*p* that fills the first trench 136*t* may be formed. Next, the second pre-conductive layer 132*p*, the third pre-conductive layer 133*p*, and the pre-capping pattern 134*p* may be sequentially formed on the first pre-conductive layer 131*p* and the pre-direct contact 136*p*.

Figure 8:
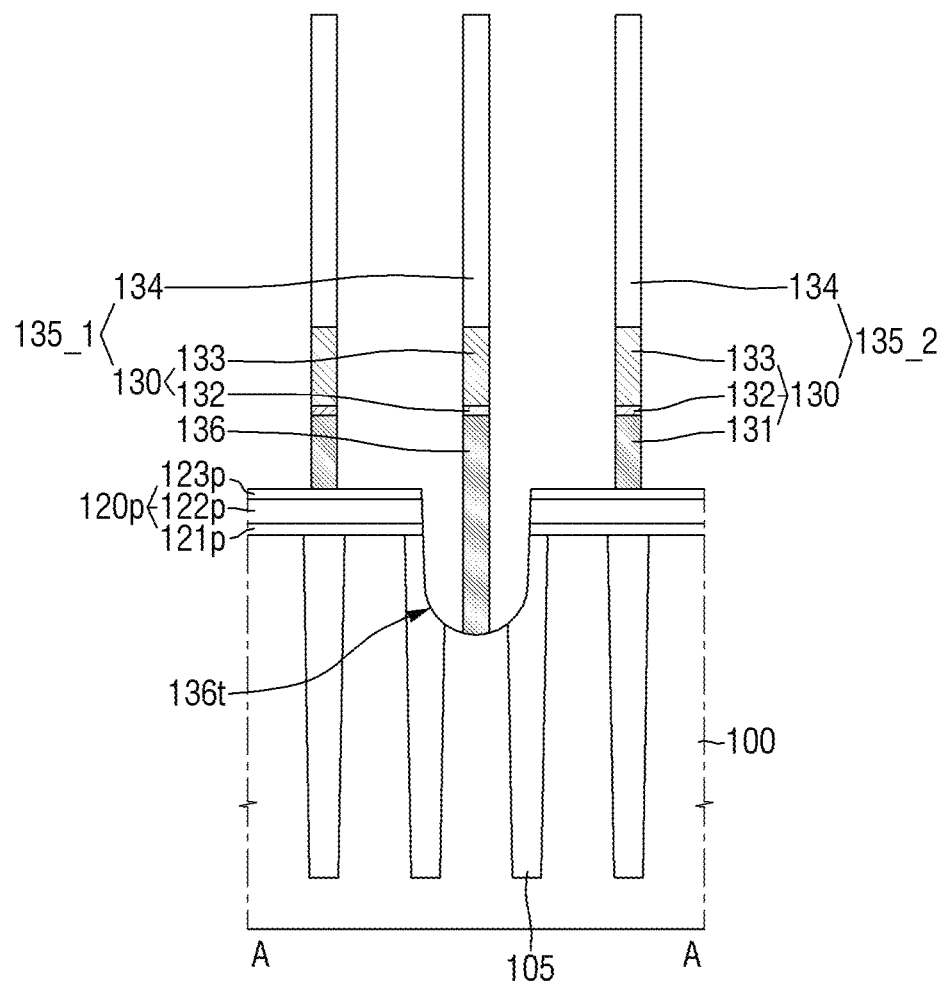

Referring to FIG. 8, the plurality of pre-conductive layers, e.g., first to third pre-conductive layers 131*p*, 132*p*, and 133*p*, etc., the pre-direct contact 136*p*, and the pre-capping pattern 134*p* may be patterned.

Accordingly, the bit line structures 135_1 and 135_2 elongated along the third direction DR3 (see FIG. 1) across the active region AR (see FIG. 1) and the word line structure 110 (see FIG. 1) may be formed. In at least one example embodiment, the width of the bit line structures 135_1 and 135_2 and the width of the direct contact 136 may be smaller than the width of the first trench 136*t*, but is not limited thereto. In other words, the patterned bit line structures 135_1 and 135_2 and the patterned direct contact 136 may not completely fill the first trench 136*t*, but is not limited thereto.

Figure 9:
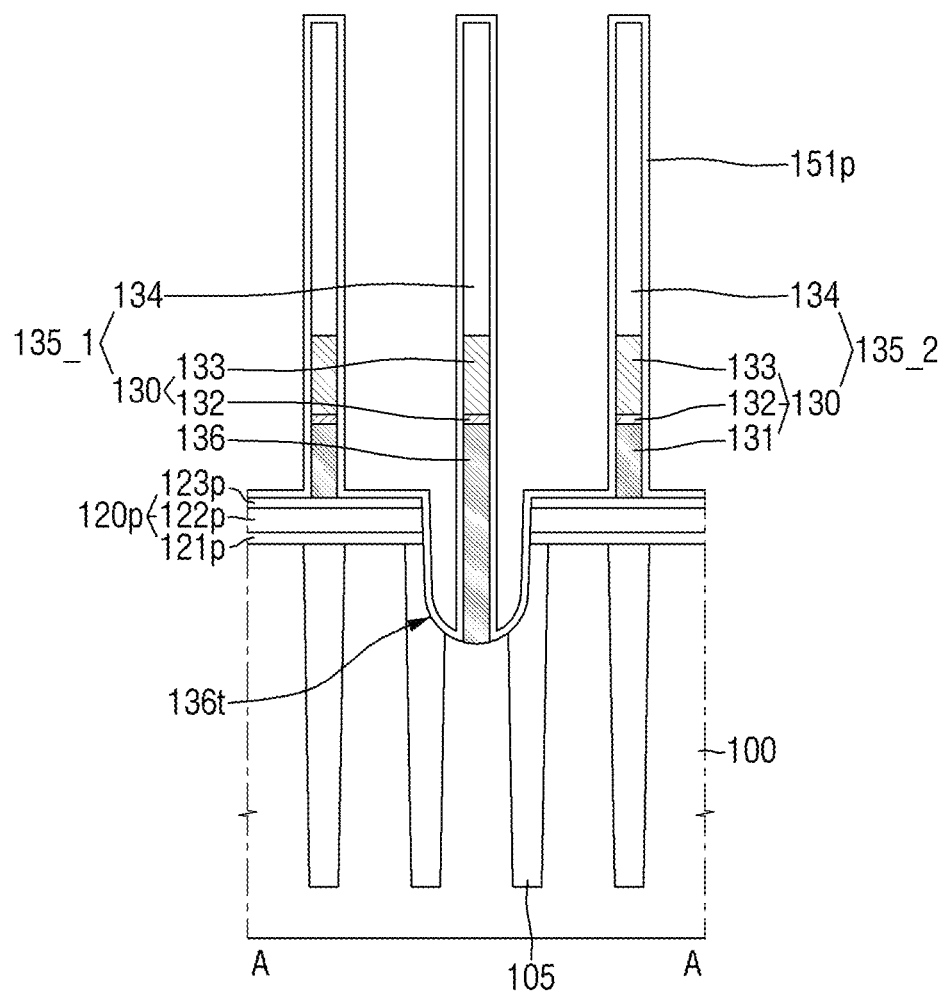

Referring to FIG. 9, a first pre-spacer layer 151*p* may be formed (e.g., grown, etc.). The first pre-spacer layer 151*p* may formed such that the first pre-spacer layer 151*p* extends along the side surfaces and the top surfaces of the bit line structures 135_1 and 135_2, the side surface of the direct contact 136, the side surface and the top surface of the insulating pattern 120, and the profile of the first trench 136*t*, but the example embodiments are not limited thereto.

The first pre-spacer layer 151*p* may be made of, e.g., silicon oxide, but is not limited thereto. For example, the first pre-spacer layer 151*p* may be formed by an atomic layer deposition (ALD) process, but is not limited thereto.

Figure 10:
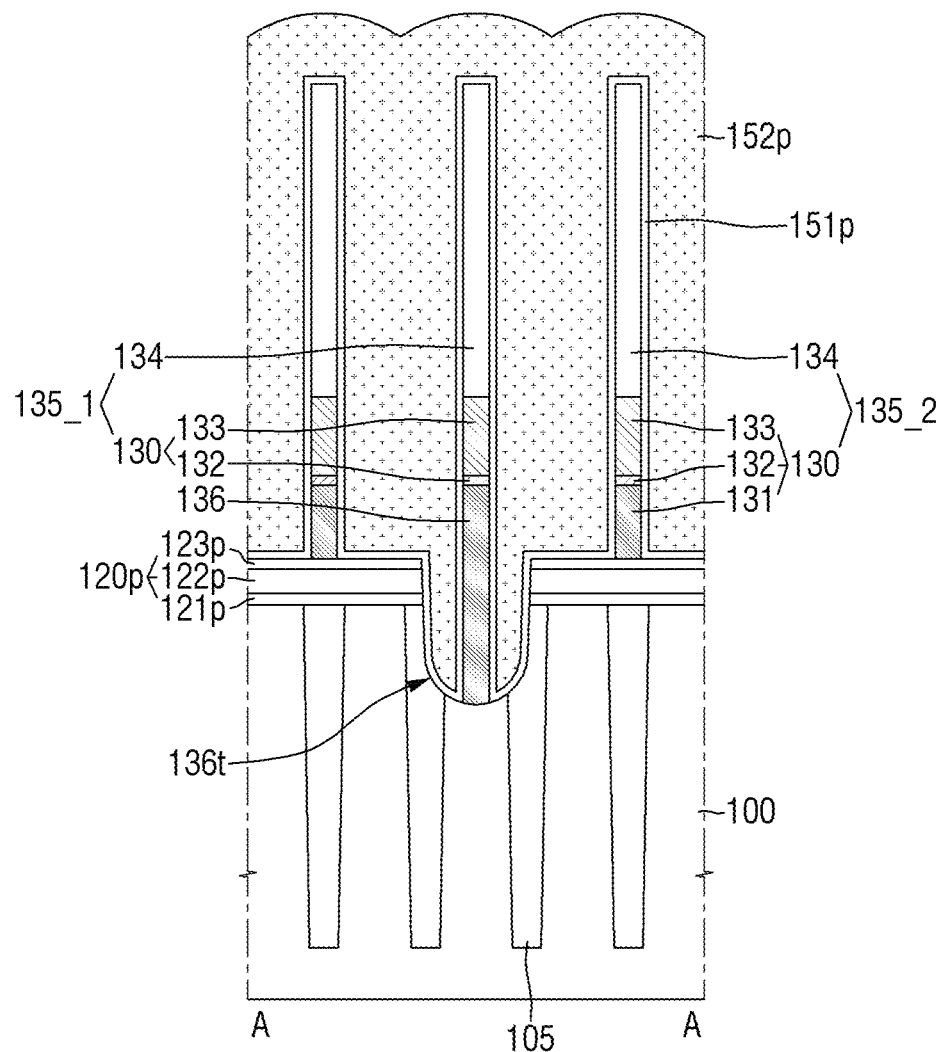

Referring to FIG. 10, a second pre-spacer layer 152*p* may be formed. The second pre-spacer layer 152*p* may be formed on the first pre-spacer layer 151*p*, but is not limited thereto. The second pre-spacer layer 152*p* may cover both the first and second bit line structures 135_1, 135_2, but the example embodiments are not limited thereto.

For example, the second pre-spacer layer 152*p* may contain a material different from that of the first pre-spacer layer 151*p*. The second pre-spacer layer 152*p* may contain a material having an etching selectivity different from that of the first pre-spacer layer 151*p*. The second pre-spacer layer 152*p* may contain silicon nitride, but is not limited thereto.

Figure 11:
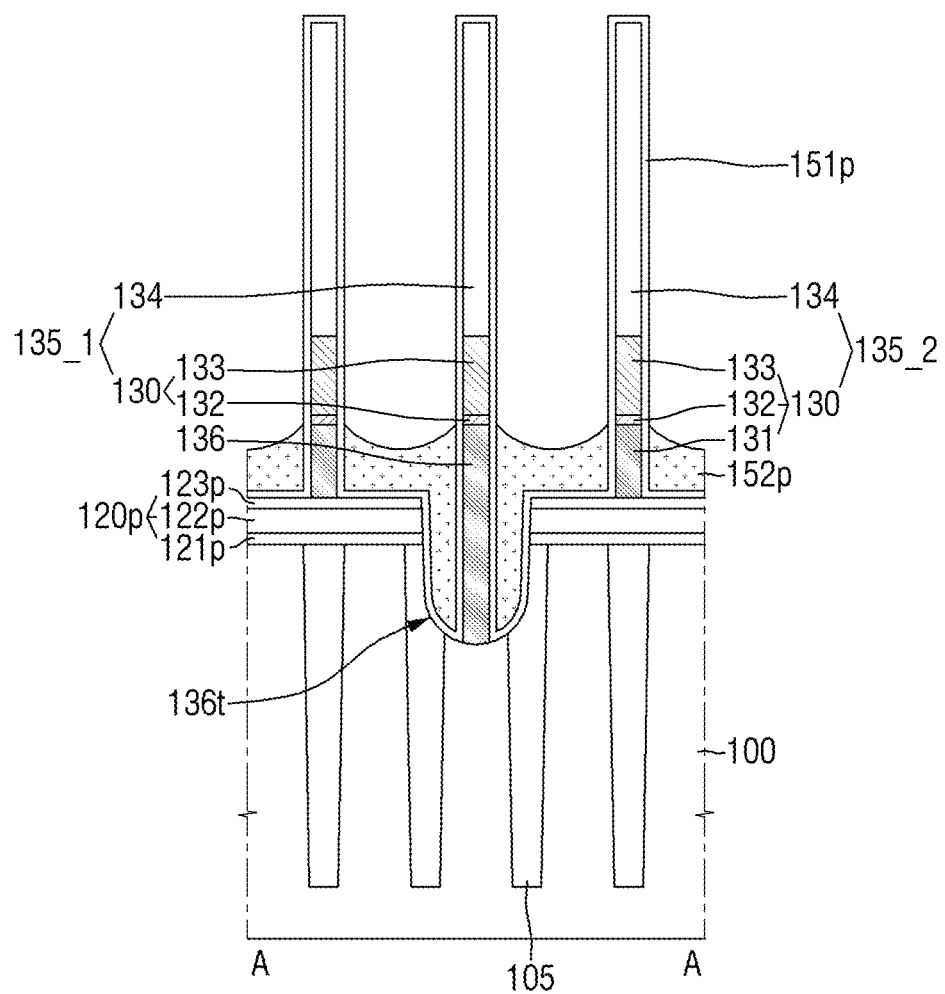

Referring to FIG. 11, an etchback process may be performed on the semiconductor device such that the top surface of the second pre-spacer layer 152*p* is etched such that it is on the same or substantially the same plane (e.g., level with, etc.) as the top surface of the direct contact 136, but the example embodiments are not limited thereto. The etchback process may be performed by, e.g., a wet etching process using phosphoric acid ($H_3PO_4$), etc., but the example embodiments are not limited thereto. Additionally, the top surface of the second pre-spacer layer 152*p* may be etched such that it is on the same or substantially the same plane (e.g., level with, etc.) as the top surface of the first conductive layer 131, but the example embodiments are not limited thereto.

Figure 12:
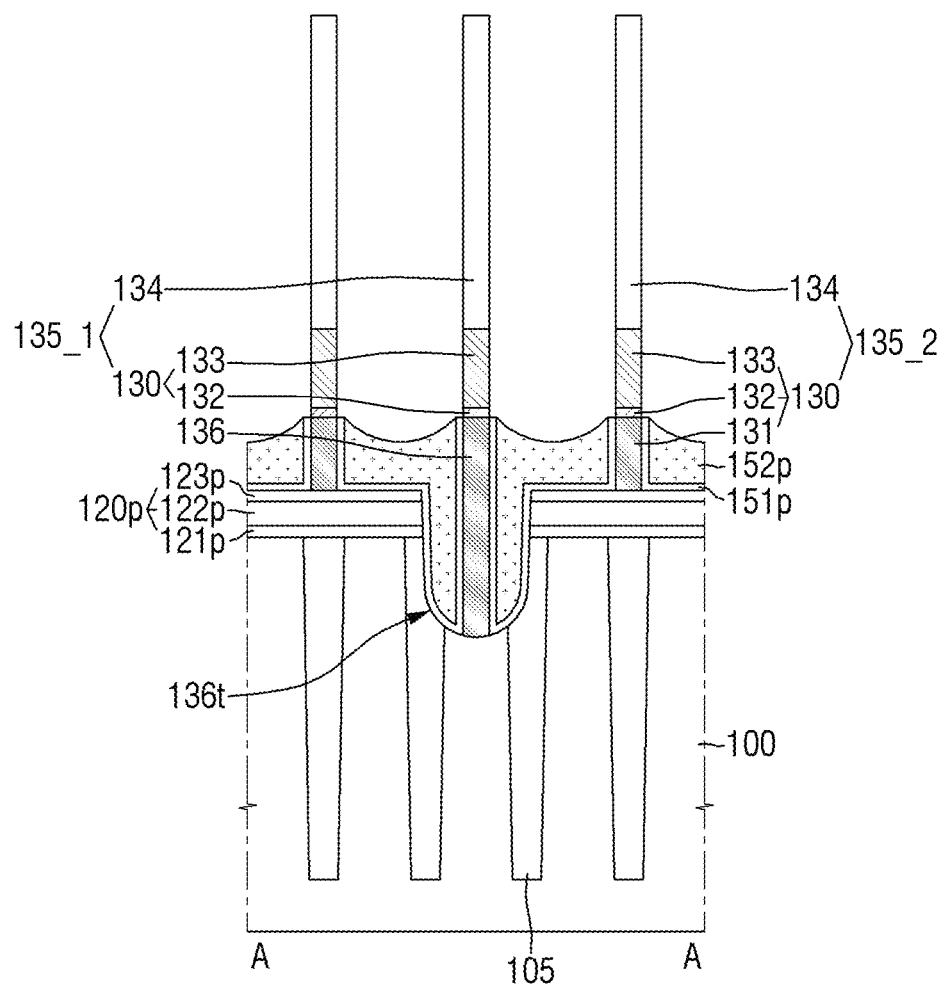

Referring to FIG. 12, the first pre-spacer layer 151*p* may be partially etched, but is not limited thereto. The first pre-spacer layer 151*p* may be etched to be on the same or substantially the same plane (e.g., level with, etc.) as the top surface of the direct contact 136, but is not limited thereto. Accordingly, the top surface of the first pre-spacer layer 151*p* may be on the same or substantially the same plane (e.g., level with, etc.) as the top surface of the second pre-spacer layer 152*p*, but is not limited thereto. Further, the top surface of the first pre-spacer layer 151*p* may be on the same or substantially the same plane (e.g., level with, etc.) as the top surface of the first conductive layer 131, but the example embodiments are not limited thereto.

Figure 13:
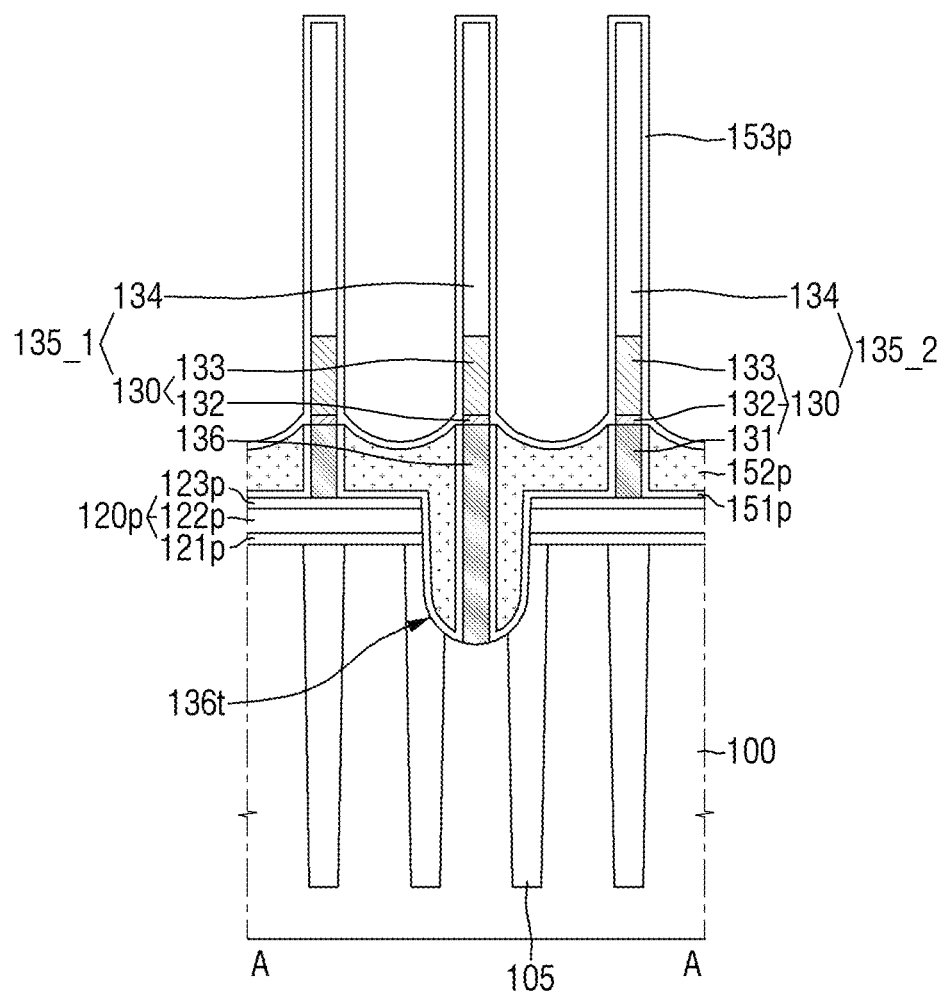

Referring to FIG. 13, a third pre-spacer layer 153*p* may be formed (e.g., grown, etc.). The third pre-spacer layer 153*p* may formed such that the third pre-spacer layer 153*p* extends along the top surface of the second pre-spacer layer 152*p*, the top surface of the first pre-spacer layer 151*p*, and/or the side surfaces and the top surfaces of the bit line structures 135_1 and 135_2 exposed by the first and second pre-spacer layers 151*p* and 152*p*, but the example embodiments are not limited thereto.

The third pre-spacer layer 153*p* may contain silicon nitride, but is not limited thereto.

Figure 14:
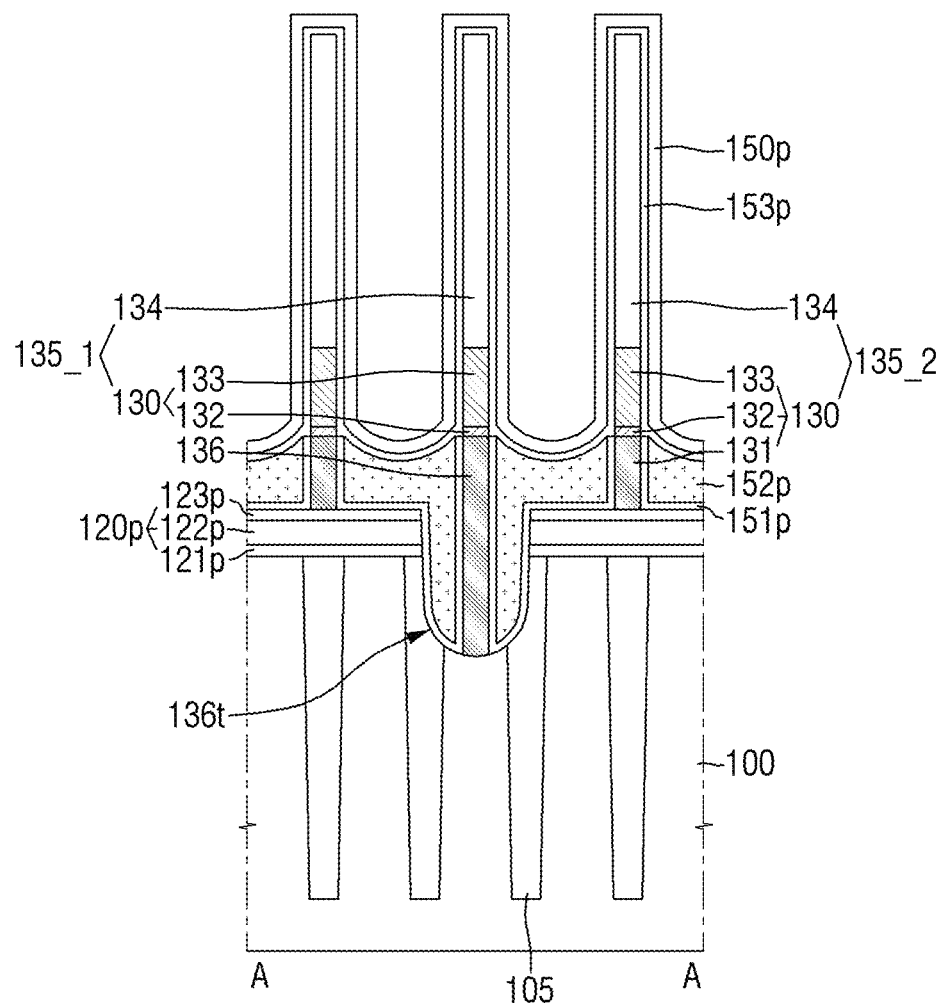

Referring to FIG. 14, a sacrificial spacer layer 150*p* may be formed (e.g., grown, etc.). The sacrificial spacer layer 150*p* may be formed on the third pre-spacer layer 153*p*, etc.

The third pre-spacer layer 153*p* may contain silicon oxide, but is not limited thereto. For example, the third pre-spacer layer 153*p* may be formed by the ALD process, etc.

Figure 15:
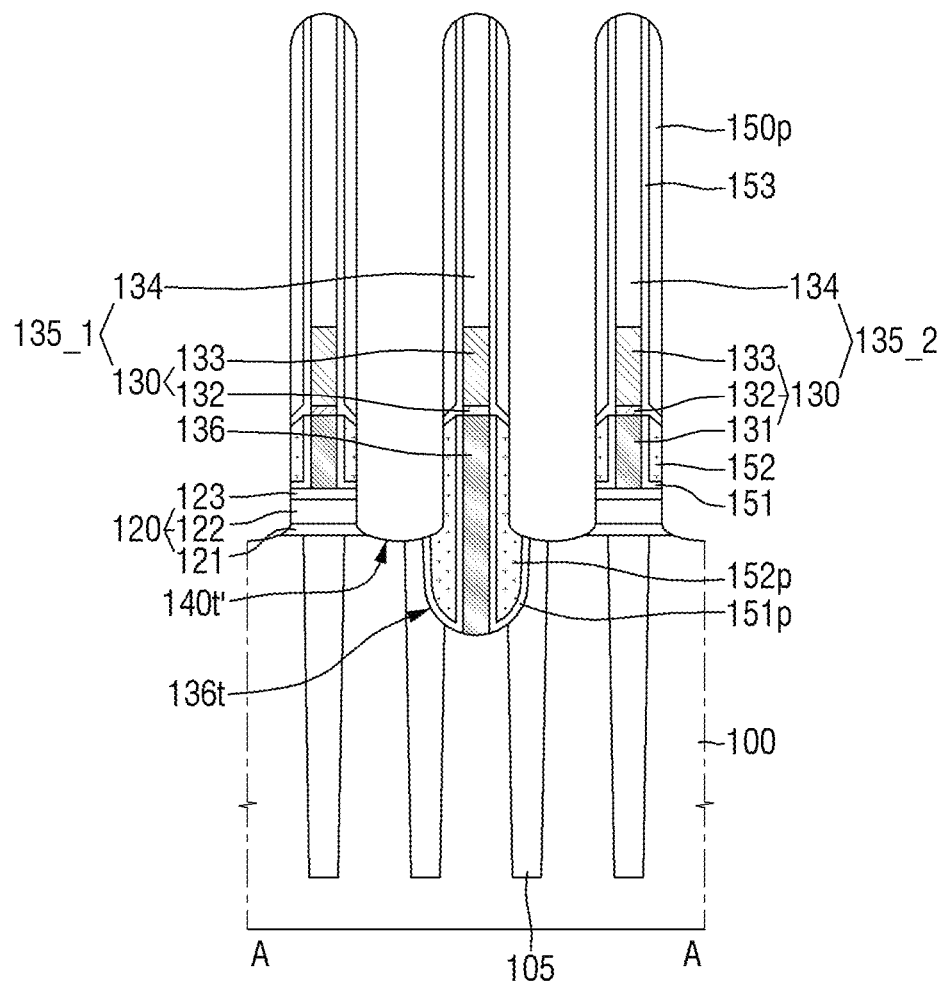

Referring to FIG. 15, a pre-contact recess 140*t*' may be formed between the bit line structures 135_1 and 135_2, etc. The bottom surface of the pre-contact recess 140*t*' may be on the same or substantially the same plane (e.g., level with, etc.) as the top surface of the substrate 100 or may be lower than the top surface of the substrate 100, etc. The pre-contact recess 140*t*' may penetrate a pre-insulating pattern 120*p* (see FIG. 14), the first to third pre-spacer layers 151*p*, 152*p*, and 153*p* (see FIG. 14), and/or the sacrificial spacer layer 150*p* to expose a part of the active region AR, but the example embodiments are not limited thereto. Further, the sacrificial spacer layer 150p and the third pre-spacer layer 153p on the top surfaces of the bit line structures 135_1 and 135_2 may be removed (e.g., etched away, etc.). Accordingly, the insulating pattern 120 and the third spacer 153 may be formed. Further, the first spacer 151 and the second spacer 152 on the side surface of the second bit line structure 135_2 may be formed. In at least one example embodiment, the pre-contact recess 140t' may expose both ends of the active area AR (see FIG. 1), but is not limited thereto.

Figure 16:
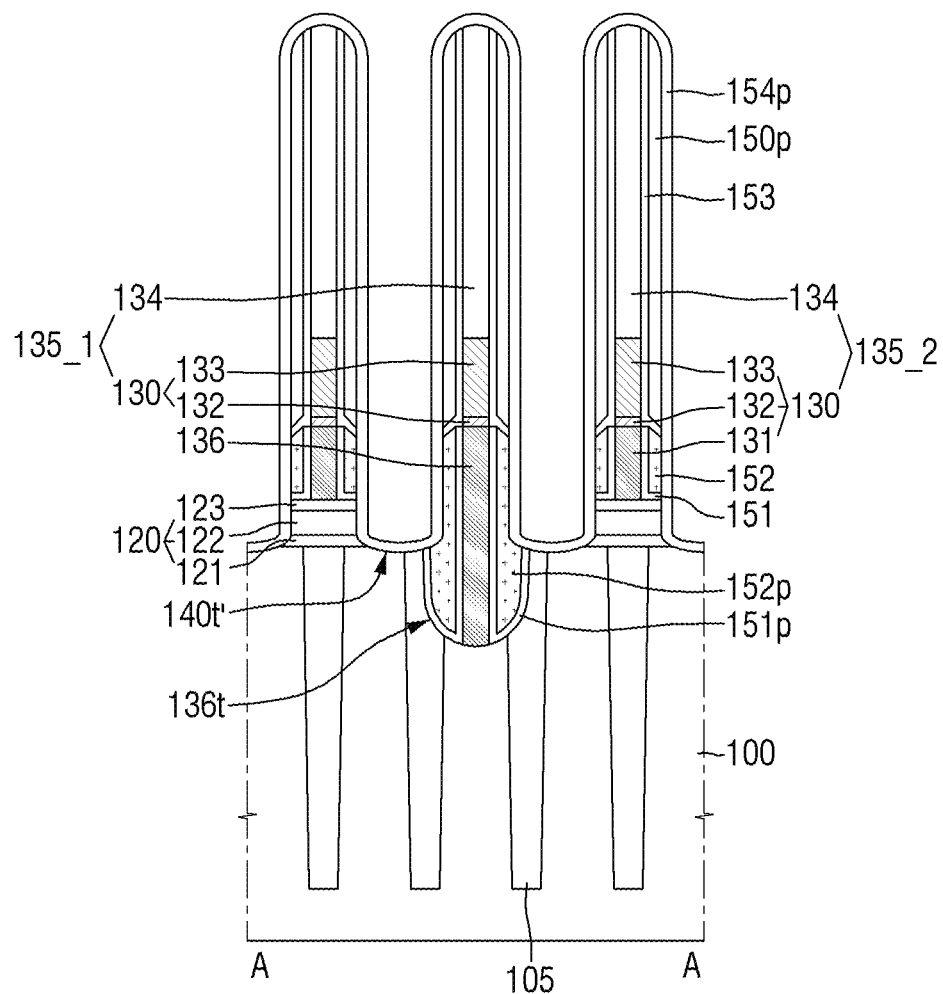

Referring to FIG. 16, a fourth pre-spacer layer 154p may be formed (e.g., grown, etc.). The fourth pre-spacer layer 154p may extend along the profile of the contact recess 140t', the side surface of the insulating pattern 120, and/or the side surfaces and the top surfaces of the bit line structures 135_1 and 135_1, etc., but the example embodiments are not limited thereto.

Figure 17:
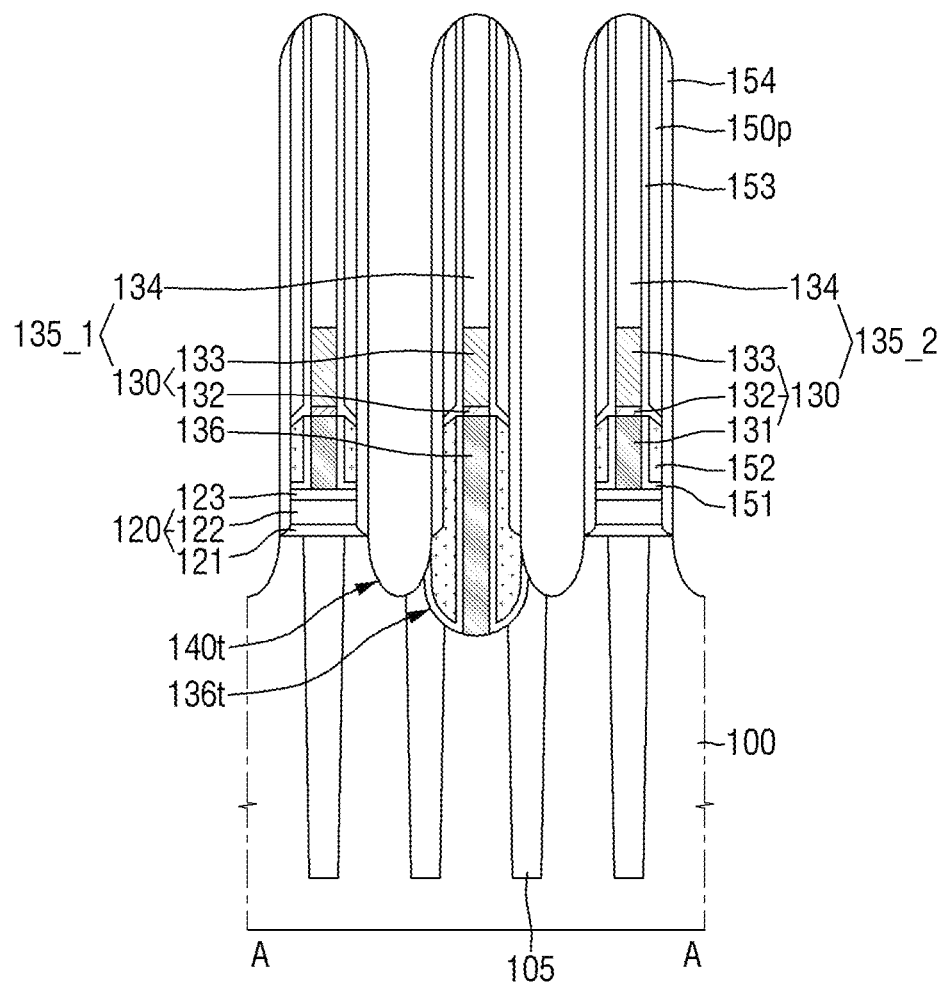

Referring to FIG. 17, the contact recess 140t may be formed between the bit line structures 135_1 and 135_2, etc. The bottom surface of the contact recess 140t may be lower than the top surface of the substrate 100, but is not limited thereto. For example, the contact recess 140t may be formed in the active region AR (see FIG. 1) of the substrate 100, but is not limited thereto. The contact recess 140t may expose a part of the active region AR. In at least one example embodiment, the contact recess 140t may expose both ends of the active region AR, but is not limited thereto.

In the process of forming the contact recess 140t, the third pre-spacer layer 153p (see FIG. 13) on the top surfaces of the bit line structures 135_1 and 135_2 may be removed. Accordingly, the fourth spacer 154 may be formed. Further, a part of the first pre-spacer layer 151p (see FIG. 16) and a part of the second pre-spacer layer 152p (see FIG. 16) on the side surface of the first bit line structure 135_1 may be removed. Accordingly, the first spacer 151 and the second spacer 152 may be formed.

Figure 18:
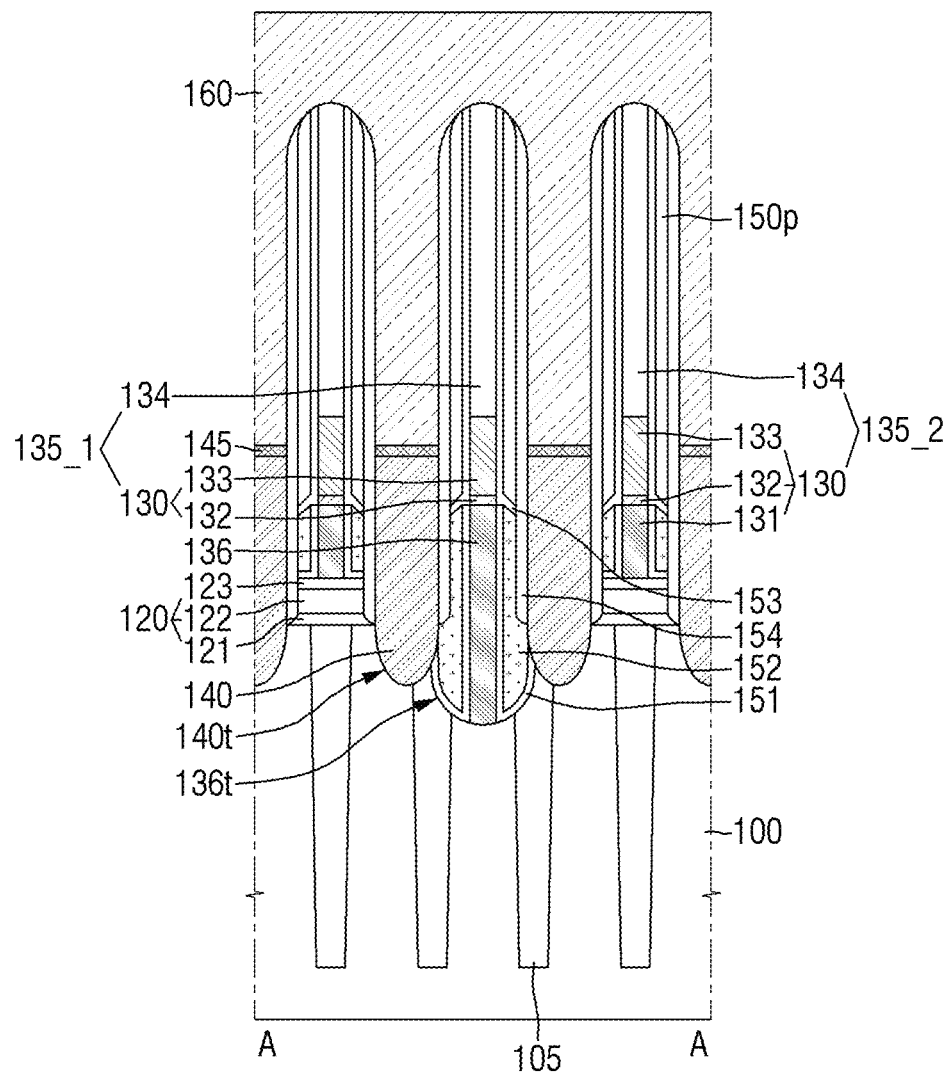
Figure 18:
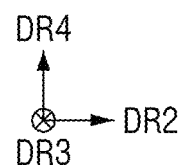

Referring to FIG. 18, the contact structures 140, 145, and 160 may be formed in the contact recess 140t, but the example embodiments are not limited thereto.

For example, a conductive layer may be formed on the resultant structure of FIG. 18. Next, the etchback process may be performed such that the top surface of the conductive layer becomes lower than the top surfaces of the bit line structures 135_1 and 135_2, but is not limited thereto. Accordingly, the buried contacts 140 forming a plurality of isolated regions may be formed. The buried contact 140 may include polysilicon, without being limited thereto.

Then, the silicide layer 145 and the landing pad 160 may be sequentially formed on the buried contact 140. In at least one example embodiment, the top surface of the landing pad 160 may be higher than the top surfaces of the bit line structures 135_1 and 135_2, but the example embodiments are not limited thereto. The landing pad 160 may include, for example, tungsten (W), without being limited thereto.

Figure 19:
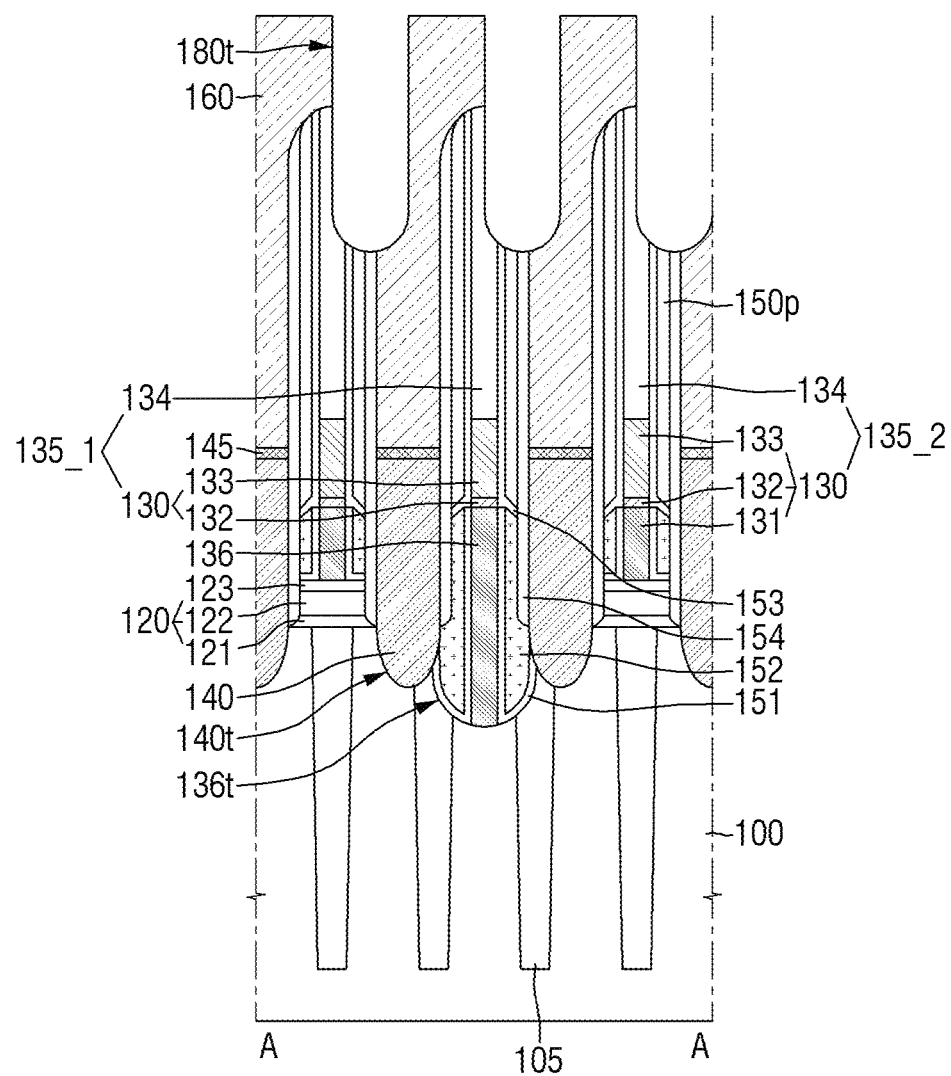

Referring to FIG. 19, the third trench 180t may be formed in the landing pad 160. In other words, the landing pad 160 may be patterned by the third trench 180t. Accordingly, the landing pads 160 forming a plurality of isolated regions may be formed. In at least one example embodiment, the third trench 180t may be formed such that the plurality of landing pads 160 are arranged in a honeycomb structure, but is not limited thereto. Accordingly, as shown in FIG. 1, the plurality of landing pads 160 arranged in the honeycomb structure may be formed.

In at least one example embodiment, the third trench 180t may overlap the sacrificial spacer layer 150p. Accordingly, the upper portion of the sacrificial spacer layer 150p may be exposed by the third trench 180t.

Figure 20:
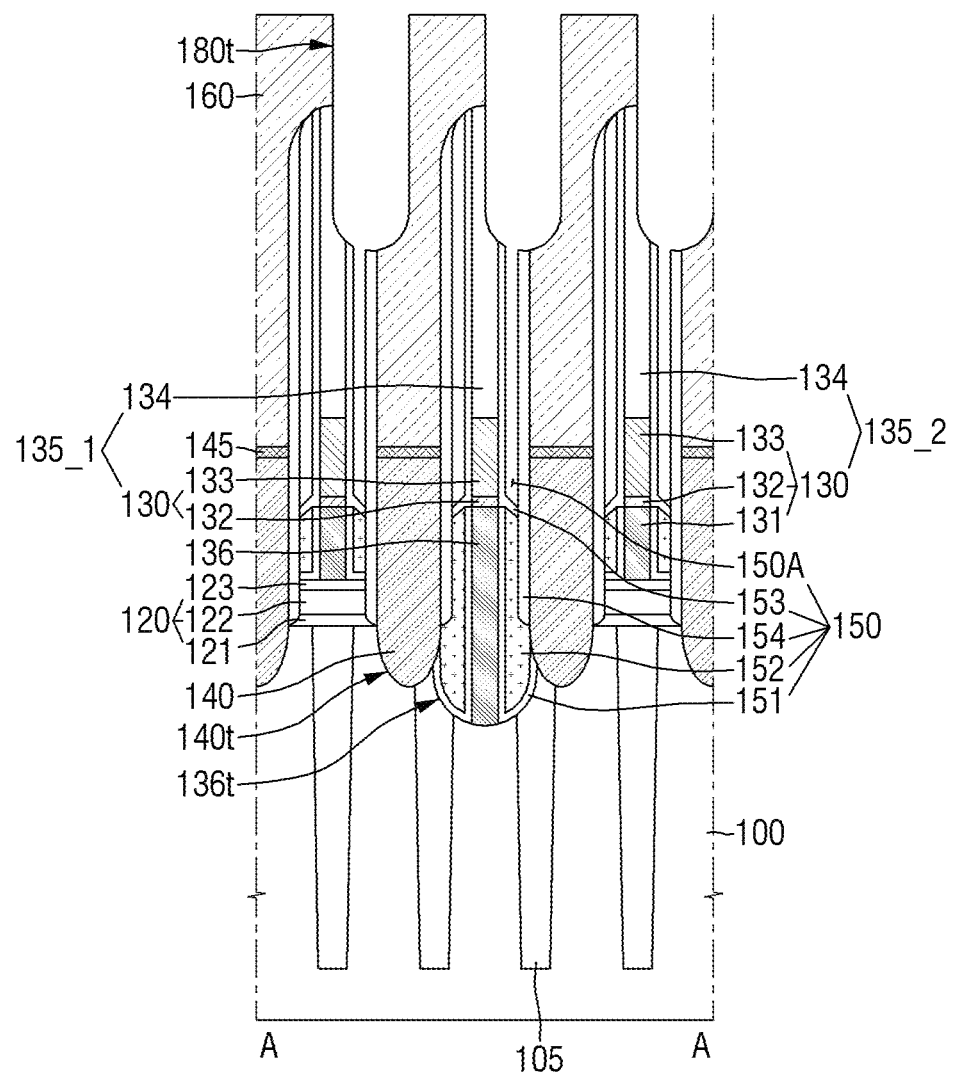

Referring to FIG. 20, the sacrificial spacer layer 150p is removed to form the air spacer 150A.

For example, after the third trench 180t is formed, a wet etching process may be performed, but the example embodiments are not limited thereto. The wet etching process may be performed using, e.g., hydrogen fluoride (HF) or phosphoric acid ($H_3PO_4$), but the example embodiments are not limited thereto. Accordingly, the sacrificial spacer layer 150p exposed by the third trench 180t may be removed, and the air spacer 150A defined by the third and fourth spacers 153 and 154 may be formed.

Figure 21:
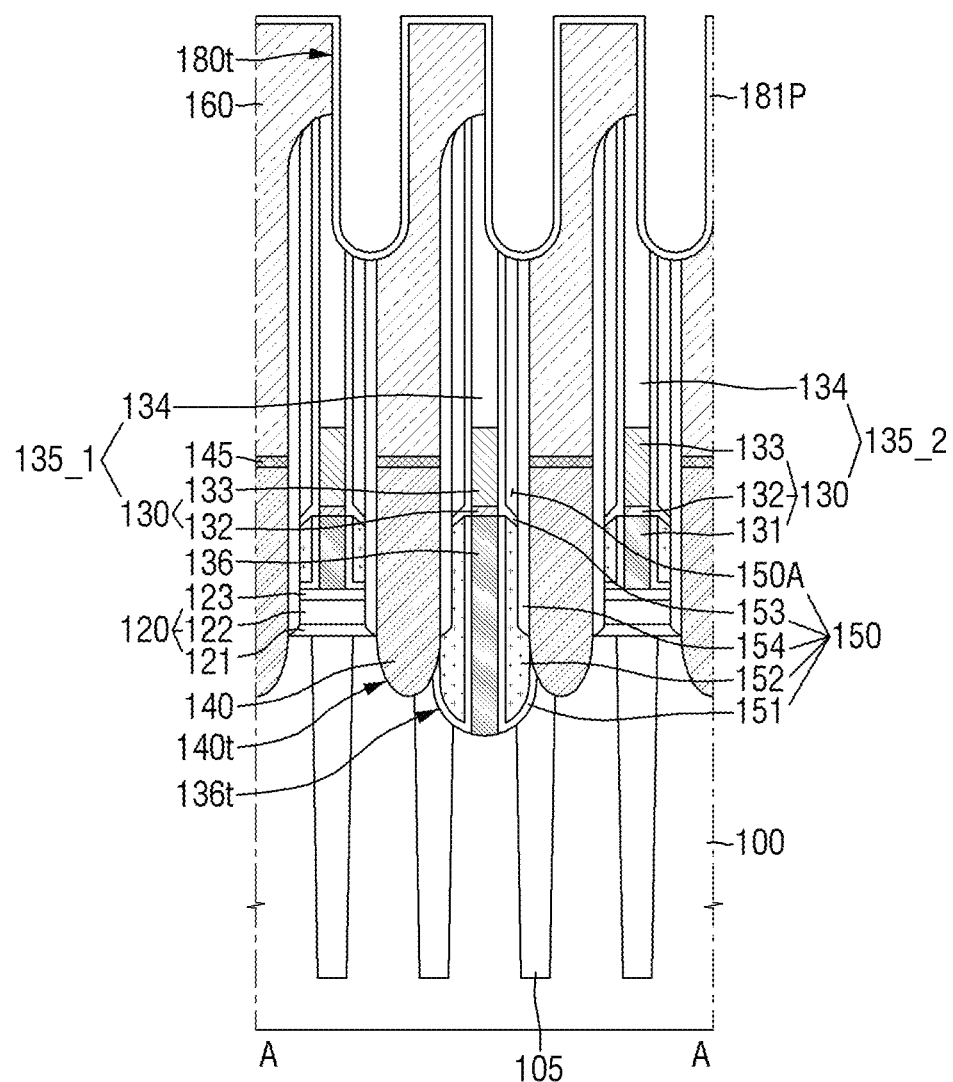
Figure 21:
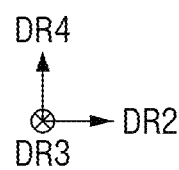

Referring to FIG. 21, a first pre-layer 181p may be formed. The first pre-layer 181p may be formed (e.g., grown, etc.) along the profile of the third trench 180t and the top surface of the landing pad 160. The first pre-layer 181p may contain SiCN, but the example embodiments are not limited thereto.

Figure 22:
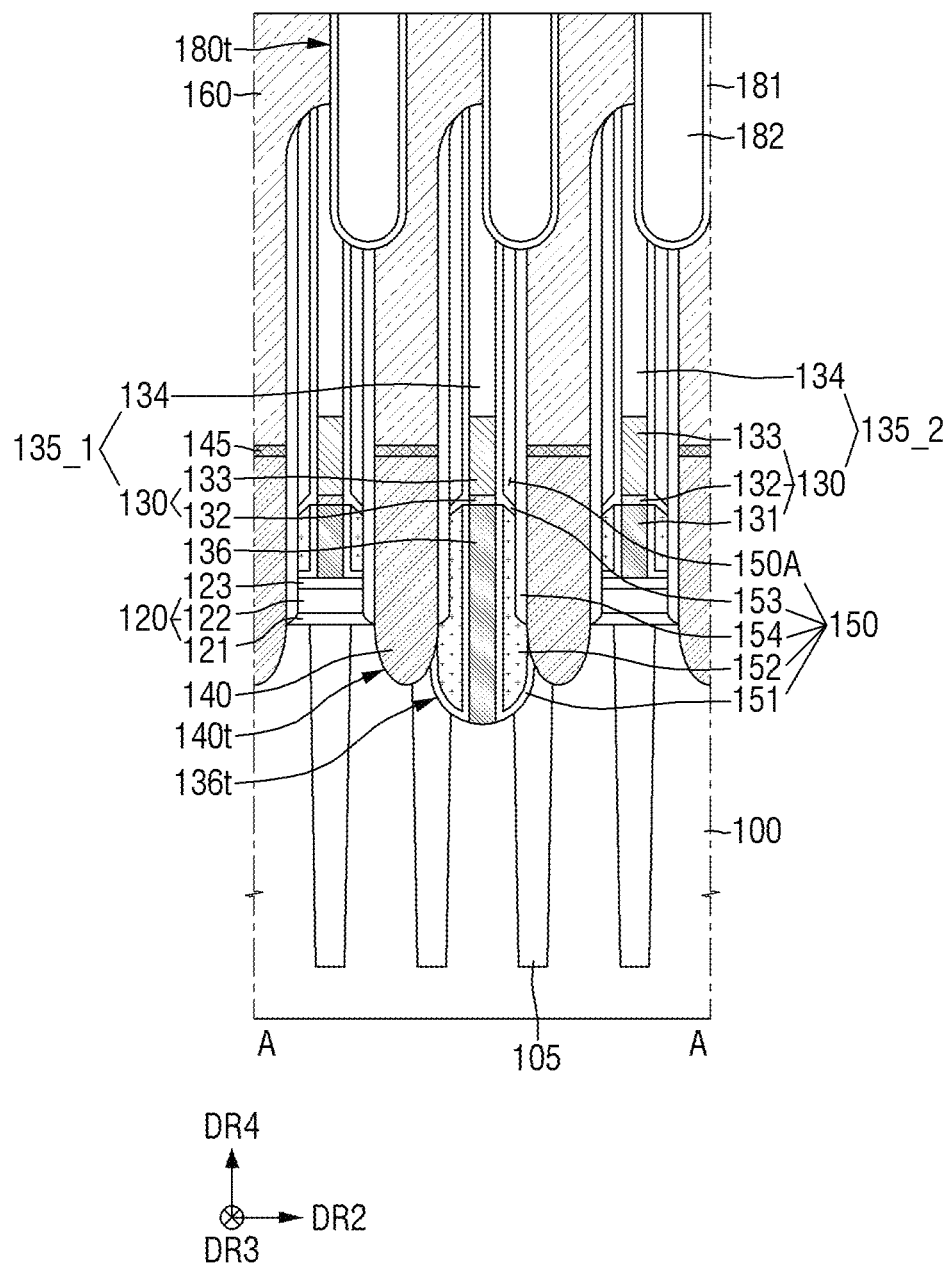

Referring to FIG. 22, the second layer 182 that fills the third trench 180t may be formed on the first layer 181.

For example, a second pre-layer that fills the third trench 180t may be formed on the first pre-layer 181p (see FIG. 21), but is not limited thereto. Next, the etchback process may be performed such that the top surfaces of the first pre-layer 181p and the second pre-layer are on the same or substantially the same plane (e.g., level with, etc.) as the top surface of the landing pad 160. Accordingly, the first layer 181 and the second layer 182 that fill the third trench 180t may be formed.

Figure 23:
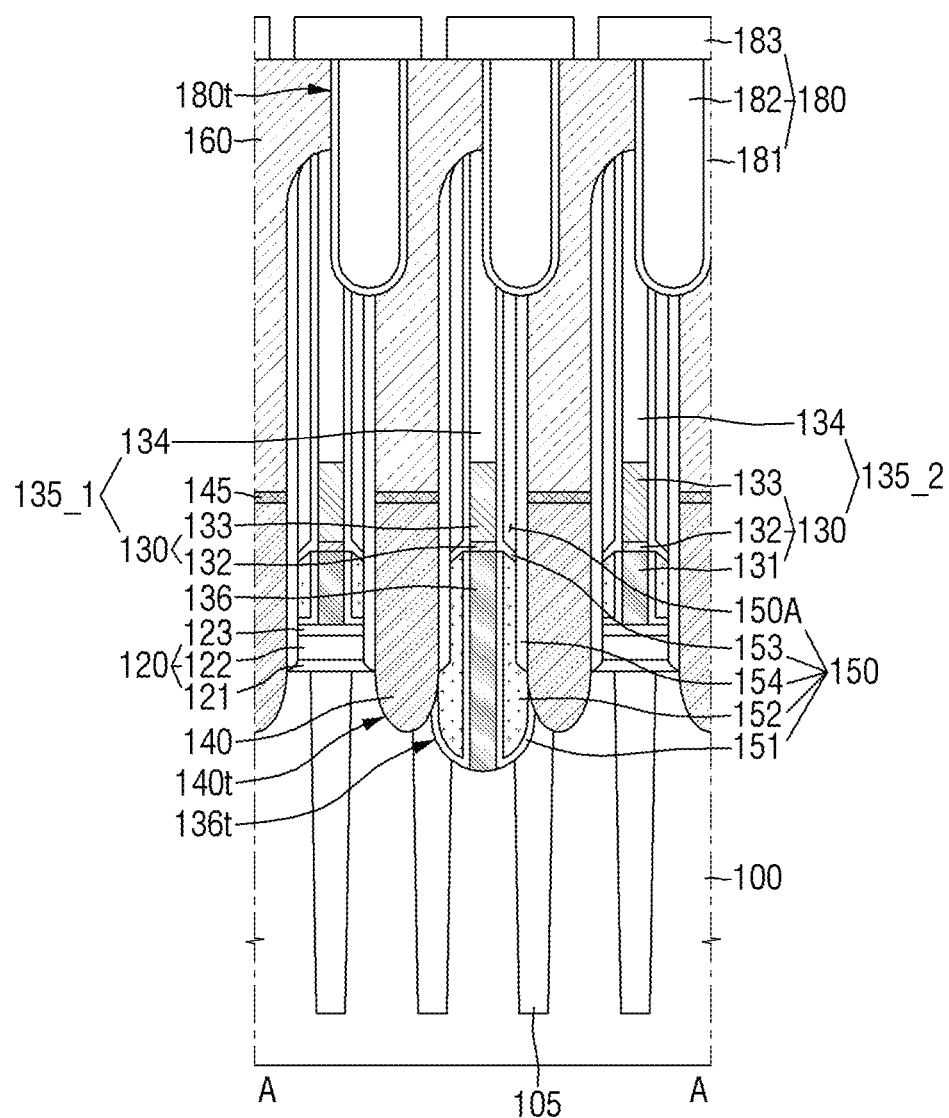
Figure 23:
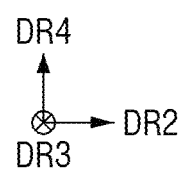

Referring to FIG. 23, the third layer 183 may be formed.

For example, a third pre-layer may be formed on the landing pad 160 and the first and second layers 181 and 182, etc. The third pre-layer may be patterned to expose at least a part of the top surface of the landing pad 160, but is not limited thereto. Accordingly, the third layer 183 may be formed, and the interlayer insulating layer 180 may be formed.

Next, referring to FIG. 2, the capacitor structure 190 may be formed.

For example, the lower electrode 191 connected to the landing pad 160 exposed by the interlayer insulating layer 180 may be formed. Next, the capacitor dielectric layer 192 and the upper electrode 193 may be sequentially formed on the lower electrode 191. Accordingly, a method for fabricating a semiconductor device having improved operating characteristics may be provided.

While various operations of at least one method for fabricating a semiconductor device having improved operating characteristics have been discussed in connection with FIGS. 7 to 23, the example embodiments are not limited thereto, and for example, one or more of the operations may be performed in a different order than discussed herein, and/or one or more of the method operations may be performed simultaneously, etc.

In concluding the detailed description, one of ordinary skill in the art will appreciate that many variations and modifications can be made to the example embodiments without substantially departing from the principles of the inventive concepts. Therefore, the disclosed example embodiments are used in a generic and descriptive sense only and not for purposes of limitation.

What is claimed is:
1. A semiconductor device comprising:
a semiconductor substrate including a trench;
a direct contact in the trench, the direct contact having a width smaller than a width of the trench;

a bit line structure on the direct contact, the bit line structure having a width smaller than the width of the trench;
a first spacer including a first portion and a second portion, the first portion extending along an entire side surface of the direct contact, and the second portion extending along the trench;
a second spacer on the first spacer, the second spacer filling the trench;
a third spacer on the second spacer, the third spacer including a vertical portion and a horizontal portion, the vertical portion extending along a side surface of the bit line structure, and the horizontal portion extending along a top surface of the first portion of the first spacer and a top surface of the second spacer; and
an air spacer on the third spacer, the air spacer being spaced apart from the second spacer by the third spacer, wherein the first spacer includes silicon oxide.

2. The semiconductor device of claim 1, wherein the air spacer is separated from the second spacer by the horizontal portion of the third spacer.

3. The semiconductor device of claim 1, further comprising:
a fourth spacer on a top surface of the second portion of the first spacer, the fourth spacer extending along a side surface of the air spacer and a side surface of the second spacer exposed by the first spacer,
wherein the fourth spacer includes silicon nitride.

4. The semiconductor device of claim 3, wherein at least a part of a lower portion of the fourth spacer is inserted into the second spacer.

5. The semiconductor device of claim 1, wherein
the first spacer is in contact with a side surface of the direct contact;
the third spacer is in contact with a side surface of the bit line structure; and
the second spacer and the third spacer include silicon nitride.

6. The semiconductor device of claim 1, wherein the second spacer extends along the first portion of the first spacer.

7. The semiconductor device of claim 1, wherein a width of the direct contact is equal to a width of the bit line structure.

8. The semiconductor device of claim 1, wherein a width of the direct contact is smaller than a width of the bit line structure.

9. The semiconductor device of claim 1, wherein a top surface of the direct contact is on the same plane as a top surface of the first portion of the first spacer.

10. The semiconductor device of claim 1, wherein a top surface of the direct contact is lower than a top surface of the first portion of the first spacer.

11. The semiconductor device of claim 1, further comprising:
a contact structure electrically connected to the semiconductor substrate, the contact structure spaced apart from the bit line structure by the first spacer, the second spacer, the third spacer, and the air spacer; and
a capacitor structure on the contact structure, the capacitor electrically connected to the contact structure.

12. A semiconductor device comprising:
a semiconductor substrate including an element isolation layer, an active region, and a trench, the active region defined by the element isolation layer and arranged in a first direction, and the trench formed in a part of the element isolation layer and the active region;
a plurality of buried contacts connected to the active region and arranged in a second direction different from the first direction;
a direct contact in the trench, the direct contact having a width smaller than a width of the trench, and the direct contact being connected to the active region;
a plurality of bit line structures connected to the semiconductor substrate through the direct contact, the plurality of bit lines structures extending in a third direction across the active region between at least two buried contacts of the plurality of the buried contacts; and
a spacer structure extending in the third direction along side surfaces of the plurality of bit line structures,
wherein the spacer structure includes a first spacer, a second spacer, a third spacer, and an air spacer, the first spacer extending along a side surface of the direct contact and the trench, the second spacer on the first spacer and filling a remaining portion of the trench, the third spacer including a vertical portion and a horizontal portion, the vertical portion extending along a side surface of the bit line structure and the horizontal portion extending along a top surface of the second spacer, and the air spacer on the third spacer and spaced apart from the second spacer by the vertical portion of the third spacer, and
the first spacer including silicon oxide.

13. The semiconductor device of claim 12, wherein the second spacer and the third spacer include silicon nitride.

14. The semiconductor device of claim 12, wherein an uppermost surface of the first spacer is on a same plane as, or higher, than a top surface of the direct contact.

15. The semiconductor device of claim 12, wherein the direct contact and one of the plurality of bit line structures have the same width in the second direction.

16. The semiconductor device of claim 12, wherein a width of a lower portion of one of the plurality of bit line structures is smaller than a width of an upper portion of one of the plurality of bit line structures in the second direction.

17. The semiconductor device of claim 12, wherein a height between a bottom surface of the element isolation layer to the top surface of the second spacer decreases as a distance of the top surface of the second spacer from one of the plurality of bit line structures increases.

18. The semiconductor device of claim 17, wherein a height between a bottom surface of the element isolation layer to the top surface of the second spacer is equal to or smaller than a height between the semiconductor substrate to an uppermost surface of the first spacer.

19. A semiconductor device comprising:
a semiconductor substrate including a gate trench;
at least one gate electrode filling at least a part of the gate trench and extending in a first direction;
at least one source/drain region on a side surface of the at least one gate electrode;
a plurality of buried contacts electrically connected to the at least one source/drain region, the plurality of buried contacts being arranged in the first direction;
at least one landing pad on the at least one buried contact;
at least one capacitor structure on the at least one landing pad and electrically connected to the at least one landing pad and the at least one buried contact;
at least one bit line structure extending in a second direction between at least two of the plurality of buried contacts, the at least one bit structure including a conductive pattern and a capping pattern on the conductive pattern; and a spacer structure on a side surface of the at least one bit line structure and extending in the second direction,
wherein the spacer structure includes,
- a first spacer extending along a lower side surface of the bit line structure,
- a second spacer on the first spacer,
- a third spacer extending along an upper side surface of the bit line structure, a top surface of the first spacer, and a top surface of the second spacer,
- an air spacer above the second spacer and the third spacer, the air spacer spaced apart from the second spacer by the third spacer,
- a fourth spacer on the second spacer and the air spacer on the top surface of the first spacer,
- the first spacer including silicon oxide, and
- the second to fourth spacers including silicon nitride.

20. The semiconductor device of claim 19, wherein
a lower portion of the at least one bit line structure includes polysilicon; and
the first spacer is in contact with an entire side surface of the lower portion of the at least one bit line structure.

* * * * *